(12) United States Patent
Astley et al.

(10) Patent No.: US 7,936,299 B2
(45) Date of Patent: May 3, 2011

(54) CAPACITIVE INTEGRATE AND FOLD CHARGE-TO-DIGITAL CONVERTER

(75) Inventors: Oliver Richard Astley, Niskayuna, NY (US); Naresh Kesavan Rao, Niskayuna, NY (US); Feng Chen, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 11 days.

(21) Appl. No.: 12/495,794

(22) Filed: Jun. 30, 2009

(65) Prior Publication Data

US 2010/0328131 A1    Dec. 30, 2010

(51) Int. Cl.
*H03M 1/12*    (2006.01)
(52) U.S. Cl. .................. 341/172; 341/155; 341/156
(58) Field of Classification Search .................. 341/172, 341/119, 155, 156, 158
See application file for complete search history.

(56) References Cited

U.S. PATENT DOCUMENTS

| | | | |
|---|---|---|---|
| 5,579,007 A | 11/1996 | Paul | |
| 6,366,231 B1 | 4/2002 | Rao et al. | |
| 6,972,706 B2 * | 12/2005 | Snoeijs | 341/158 |
| 7,019,506 B2 | 3/2006 | Kernahan | |
| 7,126,509 B2 * | 10/2006 | Sit et al. | 341/119 |
| 7,319,423 B2 * | 1/2008 | Augusto et al. | 341/155 |
| 2002/0196172 A1 | 12/2002 | Bult | |
| 2006/0038712 A1 | 2/2006 | Harrison et al. | |

* cited by examiner

*Primary Examiner* — Jean B Jeanglaude
(74) *Attorney, Agent, or Firm* — Seema S. Katragadda

(57) ABSTRACT

A circuit for converting a charge signal into a binary format of output bits comprises: an integration circuit including an operational transconductance amplifier having an inverting input terminal and an output terminal, an integrating capacitor connected between the inverting input terminal and the output terminal, the integrating capacitor for storing a charge input selectively provided by a sensor diode; and a folding circuit having a fold capacitor, the fold capacitor switchably coupled either to a fold voltage source via a fold buffer for charging the fold capacitor to a predetermined fold charge value, or to the integrating capacitor for selectively removing at least a portion of the stored charge input.

15 Claims, 18 Drawing Sheets

US 7,936,299 B2

CAPACITIVE INTEGRATE AND FOLD CHARGE-TO-DIGITAL CONVERTER

BACKGROUND OF THE INVENTION

The subject matter disclosed herein relates to charge-to-digital conversion devices and, in particular, to charge conversion performed by capacitance-based integrate-and-fold circuits.

X-ray imaging systems typically include sensor systems that transform attenuated analog x-ray signals into electronic form. The imaging system may include a data acquisition section for converting the analog signal in electronic form into a digital output signal that can be read by other digital processing elements. For imaging-based applications, this conversion process benefits from low-noise and high-dynamic range signals that can be converted at frequencies from about 500 Hz to about 100 kHz. Conventional charge-to-digital conversion circuits typically use an integration capacitor with an operational amplifier (i.e., op amp) to produce an output signal that is a function of an input charge produced by the x-ray signal. As can be appreciated by one skilled in the art, a relatively large integration capacitor may be required if the analog input signal has a relatively large range.

For example, charge to digital conversion can be accomplished via a conventional analog-to-digital conversion (ADC) circuit 10, shown in FIG. 1, which uses an amplifier with an integration capacitor and a current-mirror-based folding (or subtraction) unit to perform current folding, as disclosed in U.S. Pat. No. 6,366,231 "Integrate and fold analog-to-digital converter with saturation prevention." The ADC circuit 10 comprises an input signal circuit 12 in electronic communication with an integrate-and-fold circuit 20. The integrate-and-fold circuit 20 includes a folding circuit 30, an integrating op amp circuit 32, and a digital logic circuit 34. During operation, an analog input signal 26 is transmitted by the input signal circuit 12 to the inverting input terminal of an operational amplifier 18 in the integrating op amp circuit 32, which stores a charge proportional to the integral of the analog input signal 26. The digital logic circuit 34 functions to determine when the charge level in the integrating op amp circuit 32 reaches a predetermined value.

In an alternative method of current-based folding, shown in FIG. 2, a circuit 40 includes an integration circuit 42 to provide an analog current signal via a fold switch 44 to the inverting input terminal of the operational amplifier 18, where the non-inverting input terminal is attached to ground. An analog output signal is provided to a sample-and-hold circuit (not shown) at the output terminal of the operational amplifier 42. Both the current-folding methods illustrated in FIG. 1 and FIG. 2 perform charge subtraction from an integration capacitor 28 ($C_{INT}$) in accordance with current multiplied by time (i.e., Q=I*t).

When this charge value is reached, the digital logic circuit 34 in FIG. 1 directs the folding circuit 30 to remove a predetermined quantity of charge from the integration capacitance 28 in the integrating op amp circuit 32. This discharging process is repeated as the charge level in the integrating op amp circuit 32 is replenished, and the digital logic circuit 34 functions to keep track of the number of times the predetermined charge quantity is removed from the integration capacitance 28. After a predetermined time interval, the digital logic circuit 34 determines an output signal based on the number of discharge operations performed by the folding circuit 30. The output signal also includes any residual charge quantity remaining in the integrating op amp circuit 32 that is supplied to a sample-and-hold circuit 24.

The bits resolved by the digital logic circuit 34, along with the additional bits resolved from the residual charge quantity, can be used to provide a binary output signal. By serially removing the charge quantities from the integration capacitance 28, the integrating op amp circuit 32 can thus accommodate a larger analog input signal than could otherwise be stored by the integration capacitance 28 alone, and can thus maintain a relatively large dynamic range of voltages in the ADC circuit 10.

A multi-channel analog-to-digital conversion circuit is disclosed in U.S. Pat. No. 7,095,354 "Very linear wide-range pipelined charge-to-digital converter," in which a current processing stage is used to perform current-based folding and a subsequent voltage processing stage is used to further process analog residual from a previous stage.

The inventors herein have recognized a need to perform analog-to-digital conversion in modern imaging systems having a dynamic range requirement of six orders of magnitude or greater.

BRIEF DESCRIPTION OF THE INVENTION

A circuit for converting a charge signal into a binary format of output bits is disclosed. The charge to digital converter comprises: an integration circuit including an operational transconductance amplifier having an inverting input terminal and an output terminal, an integrating capacitor connected between the inverting input terminal and the output terminal, the integrating capacitor for storing a charge input selectively provided by a sensor diode; and a folding circuit having a fold capacitor, the fold capacitor switchably coupled either to a fold voltage source via a fold buffer for charging the fold capacitor to a predetermined fold charge value, or to the integrating capacitor for selectively removing at least a portion of the stored charge input.

In another aspect of the invention, a method of converting a charge input to a digital signal output comprises: charging an integration capacitor to a predetermined integration charge value with the charge input; charging a fold capacitor to a predetermined fold charge level with a fold voltage source; transferring charge between the integrating capacitor and the fold capacitor for a predetermined transfer time interval; and producing a digital signal output as a function of charge transferred by tracking the charge transferal via a fold logic circuit.

In yet another aspect of the invention, a multi-channel charge to digital converter comprises: a voltage divider; a plurality of converter channels, a fold buffer coupled to the voltage divider, the buffer switchably connected to each of the converter channels; wherein at least one of the converter channel includes an integration circuit including an operational transconductance amplifier having an inverting input terminal and an output terminal, an integrating capacitor connected between the inverting input terminal and the output terminal, the integrating capacitor for storing a charge input selectively provided by a sensor diode; and a folding circuit having a fold capacitor, the fold capacitor switchably coupled either to the fold buffer for charging the fold capacitor to a predetermined fold charge value, or to the integrating capacitor for selectively receiving at least a portion of the stored charge input.

Other systems and/or methods according to the embodiments will become or are apparent to one with skill in the art upon review of the following drawings and detailed description. It is intended that all such additional systems and methods be within the scope of the present invention, and be protected by the accompanying claims.

DETAILED DESCRIPTION OF THE INVENTION

Embodiments of the invention are directed towards a capacitance-based "integrate and fold" method of charge-to-digital conversion that provide for faster sampling rates of input signals than conventional methods. As used herein, the term "fold" includes the process of charge subtraction. The disclosed embodiments use the capacitance-based technique to achieve a faster sampling rate and lower power so as to enable new functionality and a broader range of applications. One technical advantage of the present invention includes smaller physical components and smaller power requirements to enable new methods in electronics packaging and assembly.

Figure 1:
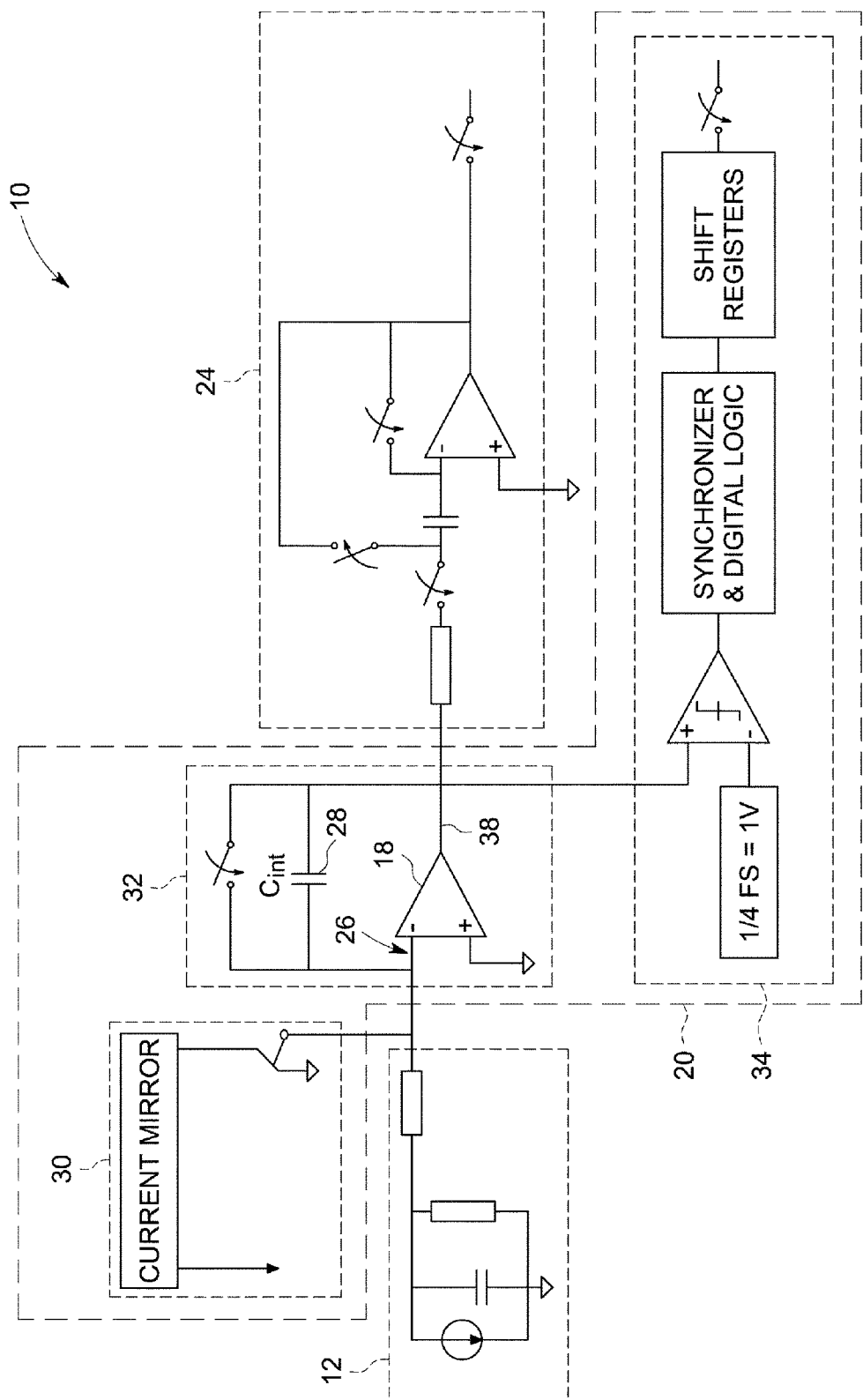
FIG. 1 shows a simplified schematic of an analog-to-digital conversion circuit having a current mirror-based folding unit, in accordance with the present state of the art.
Figure 2:
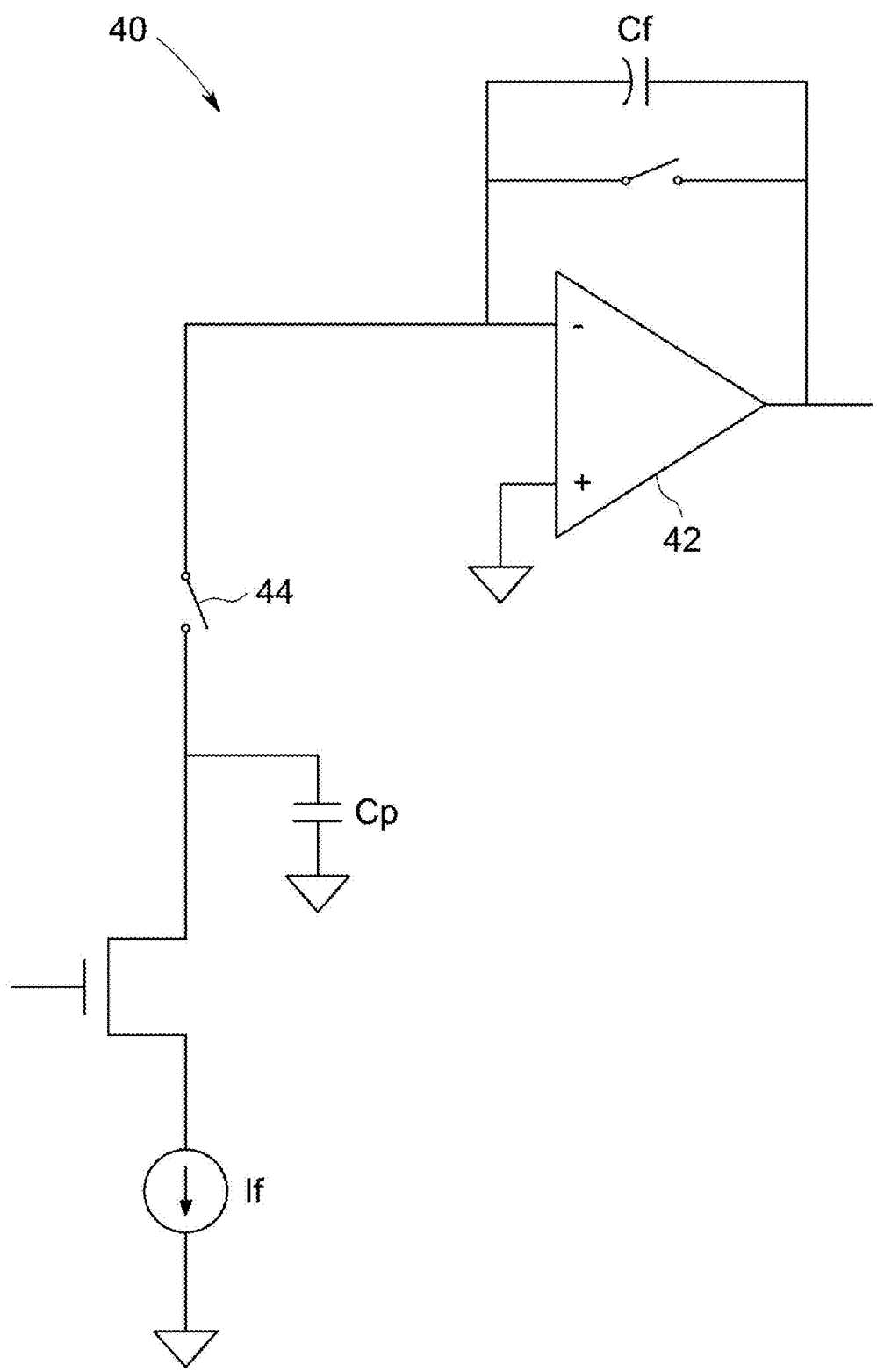
FIG. 2 shows a simplified schematic of an alternative current mirror-based folding unit, suitable for use in the conversion circuit of FIG. 1.
Figure 3:
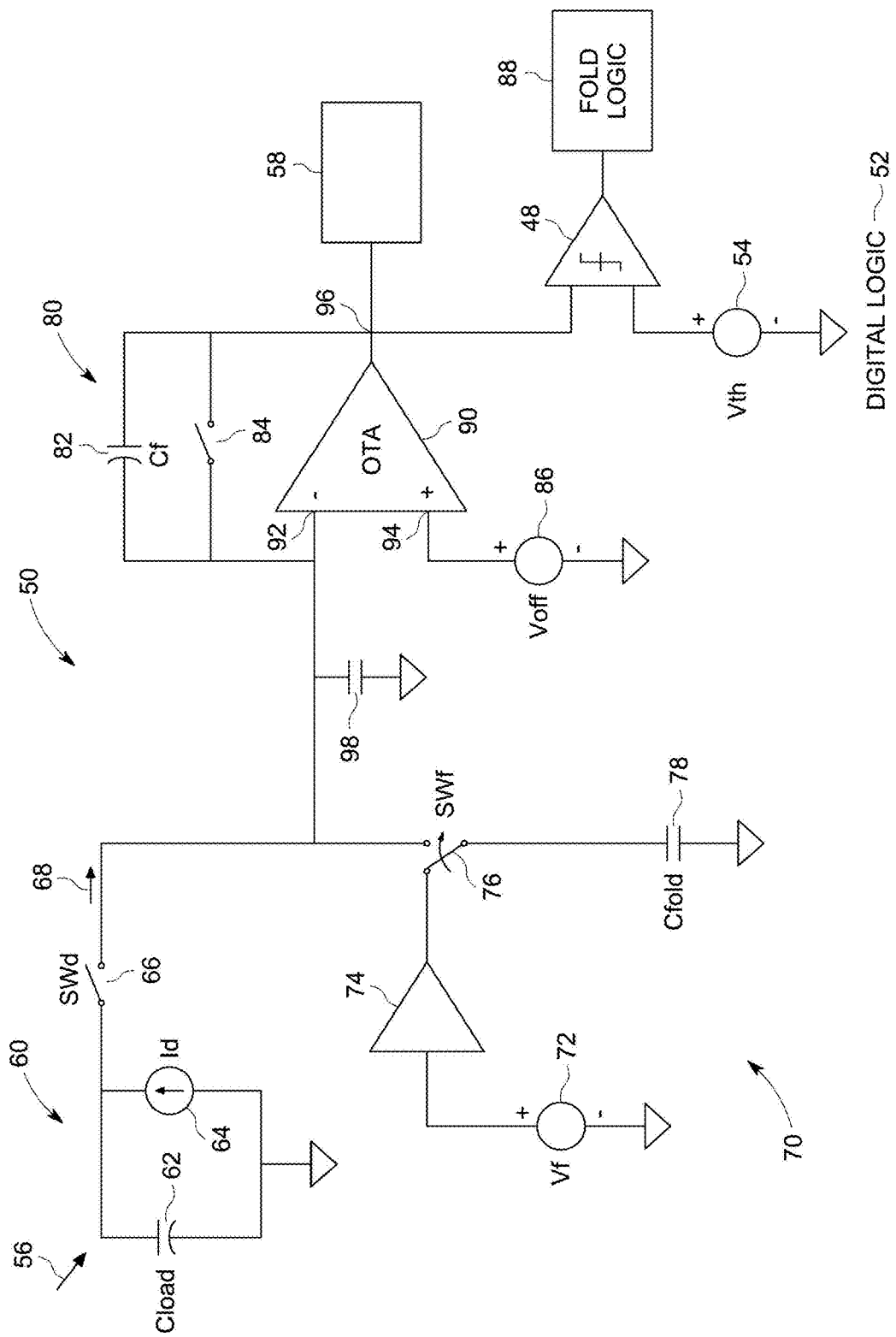
FIG. 3 shows a simplified schematic of a capacitance-based folding circuit and integration circuit used in a charge-to-digital converter, in an exemplary embodiment of the invention.

FIG. 3 is a simplified schematic diagram illustrating capacitance-based folding in a charge-to-digital converter 50, in accordance with an exemplary embodiment of the invention. The charge-to-digital converter 50 includes a capacitance-based folding circuit 70 and an integration circuit 80. An input signal 56 may be acquired by a sensor diode 60. In the illustration, the sensor diode 60 is represented by a load capacitor 62 ($C_{LOAD}$) in parallel with a diode current denoted by charge source 64 ($I_D$). The load capacitor 62 can be an external capacitor, for example, or may comprise the parasitic capacitance of the sensor diode 60. The sensor diode 60 can be selectively connected to the integration circuit 80 by operating a sensor input switch 66 ($SW_D$).

The capacitance-based folding circuit 70 may comprise a fold voltage source 72 ($V_F$) connected to a fold buffer 74, where the fold buffer 74 is connected to a fold capacitor 78 ($C_{FOLD}$) when the fold switch 76 ($SW_F$) is in a first, "charge", switch position (as shown). When the sensor input switch 66 is moved to an open position (as shown), the fold switch 76 can be moved away from the fold buffer 74 to a second, "fold", switch position (not shown). By this action, an electrical path is provided to allow for the flow of charge between the fold capacitor 78 and an integration capacitor 82 ($C_F$) in the integration circuit 80.

The integration circuit 80 further includes the offset voltage source of an operational transconductance amplifier (OTA) 90, represented by a voltage source 86 ($V_{OFF}$), connected to a non-inverting terminal 94 of the OTA 90. A capacitor 98 is shown to indicate the input capacitance of the OTA 90. The integration capacitor 82 and an integration reset switch 84 are connected in parallel between an inverting terminal 92 and an output terminal 96 of the OTA 90. The OTA 90 may transmit an analog signal output to a sample-and-hold circuit (not shown) via the output terminal 96.

The capacitance-based folding circuit 70 performs a repetitive series of charge removals by a process which utilizes charge determination by the multiplication of a voltage value with a capacitance value (i.e., Q=V*C). In an exemplary embodiment, a digital logic circuit 52 may be used to control the switch positions of the fold switch 76 and the sensor input switch 66. The fold switch 76 can be switched from the fold buffer 74 to the integration circuit 80, for example, to allow charge to flow between the fold capacitor 78 and the integration capacitor 82. This action may be taken, for example, when the charge level across the integration capacitor 82 has reached a predetermined integration charge value.

Alternatively, the integration circuit 80 may function to periodically subtract a predetermined quantity of charge from the integration capacitor 82 whenever the charge level across the integration capacitor 82 exceeds the predetermined integration charge value. This subtraction of charge folds the voltage at the output terminal 96 to a lower full-scale voltage value and can serve to prevent the OTA 90 from going to a nonlinear region and eventually saturating. It can be further appreciated that the process of charge subtraction from the integrating capacitor allows for the time integral of the signal input 56 converted by the charge-to-digital converter 50 to be larger than a maximum charge otherwise capable of being stored by the integrating capacitor 82.

Figure 4:
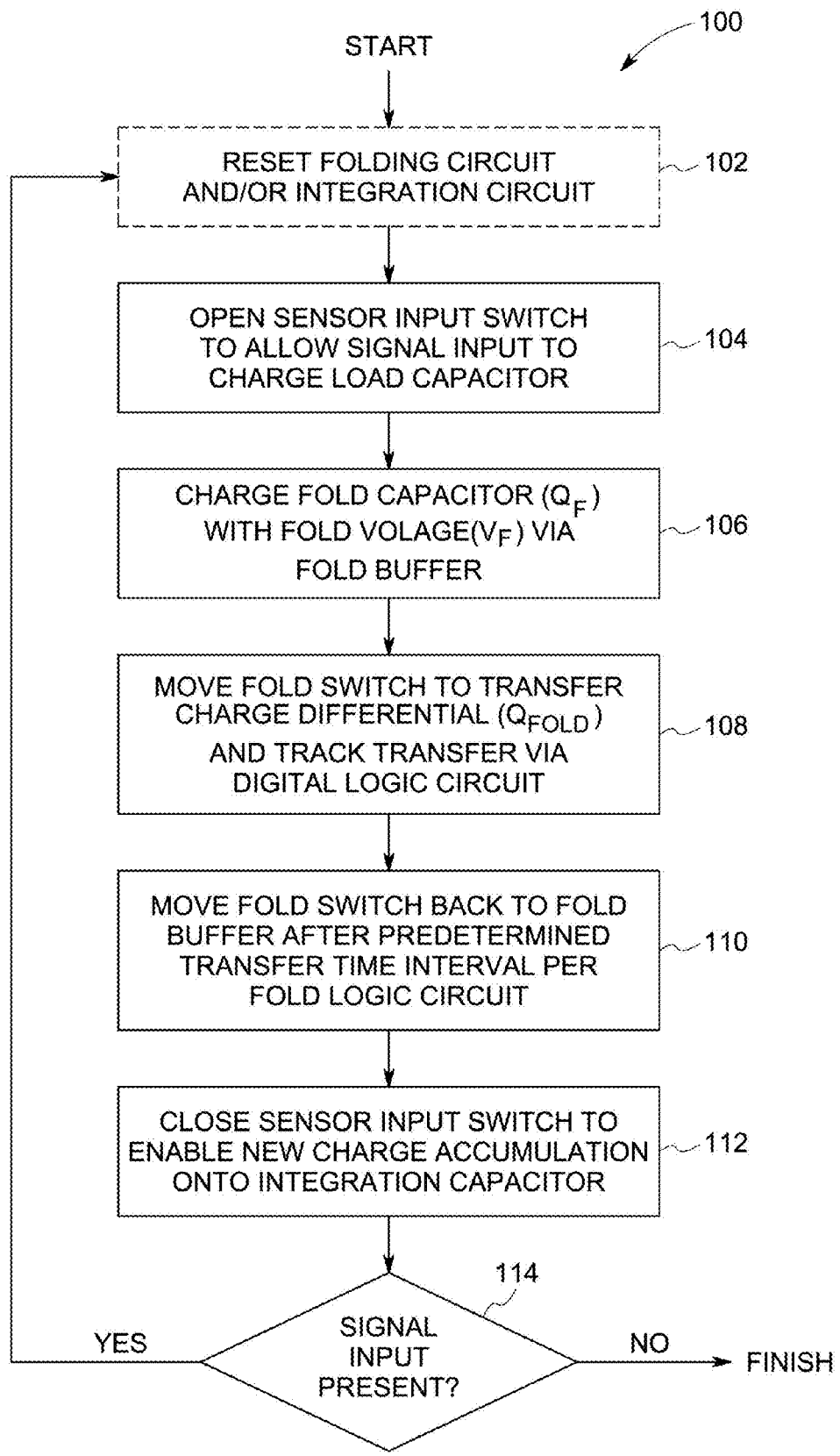
FIG. 4 is a flow diagram explaining operation of the charge-to-digital converter of FIG. 3.

Operation of the capacitance-based folding circuit 70 can be described with additional reference to a flow diagram 100, shown in FIG. 4. In the configuration shown in FIG. 3, charge stored or accumulated in the sensor diode 60 can flow to the integration capacitor 82 when the sensor input switch 66 is closed (not shown). The capacitance-based folding circuit 70 and/or the integration circuit 80 can be reset as needed, at step 102, when the charge-to-digital conversion process starts. The sensor input switch 66 may then be opened (as shown), at step 104, so as to ensure that the sensor diode 60 will continue to store additional charge, so that no signal input 56 is lost during the subsequent operational steps described below.

The fold voltage source 72 and the fold buffer 74 in the capacitance-based folding circuit 70 function to charge the fold capacitor 78, in step 106, to a predetermined fold charge level $Q_F$ given by:

$$Q_F = V_F * C_{FOLD} \quad (1)$$

During this charging period, the fold switch 76 remains connected to the output of the fold buffer 74, and the fold capacitor 78 remains disconnected from the integration capacitor 82.

While the sensor input switch 66 remains open to enable the storing of new charge on the load capacitor 62, the fold switch 76 may be moved from the output of the fold buffer 74 to connect the fold capacitor 78 to the integration capacitor 82, at step 108. This operation changes the voltage value across the fold capacitor 78 from the fold voltage value $V_F$ to the offset voltage value $V_{OFF}$ and, correspondingly, changes the charge on the fold capacitor 78. Since charge is conserved, any net charge differential imposed on the fold capacitor 78 by the change in voltage may be provided by the charge stored on the integration capacitor 82. This charge differential ($Q_{FOLD}$) is thus a function of the voltage at the offset voltage source 86 ($V_{OFF}$), the voltage at the fold voltage source 72 ($V_F$), and the value of the fold capacitor 78 ($C_{FOLD}$), and may be found using equation (2):

$$Q_{FOLD} = (V_F - V_{OFF}) * C_{FOLD} \quad (2)$$

Charge transfers may be tracked by a digital logic circuit 52.

After a predetermined transfer time interval, the position of the fold switch 76 may be moved from the inverting terminal 92 of the OTA 90 back to the output of the fold buffer 74, at step 110. Transfer of charge may be controlled by a fold logic circuit 88. As can be appreciated by one skilled in the art, the predetermined transfer time interval is a function of the charge integration accuracy desired and the values of the circuit components used in the capacitance-based folding circuit 70 and in the integration circuit 80. The fold logic circuit 88 may use the predetermined transfer time interval as a folding parameter, or the predetermined integration charge value may be a function of the rate of removal of the stored charge from the integrating capacitor 82.

The sensor input switch 66 may then be closed, at step 112, to allow the charge input 68 to flow to the integration capacitor 82. Operation of the capacitance-based folding circuit 50 may stop or pause while the signal input 56 is no longer present, at decision block 114. Otherwise, the process of the flow diagram 100 may repeat and continue by optionally resetting the capacitance-based folding circuit 70 and/or the integration circuit 80, at step 102. Alternatively, when the signal input 56 is still present, the process may skip step 102 and repeat steps 104 through 112 by opening the sensor input switch 66 to send additional charge input 68 to the load capacitor 62.

In an alternative exemplary embodiment, the fold logic circuit 88 may initiate movement of the fold switch 76 from the fold buffer 74 to the integration circuit 80 when the voltage at the output terminal 96 of the OTA 90 reaches a specified fold value. Thus, by removing charge from the integration capacitor 82 and, in turn, changing the voltage at the output terminal 96, a linear relationship may be maintained between the signal input 56 acquired by the sensor diode 60 and the corresponding output to the sample-and-hold circuit. The digital logic circuit 52 can thus keep track of the number of times a predetermined fold charge amount has been subtracted from the integration capacitor 82 and produce a digital output signal in response to a flow of charge.

As understood by one skilled in the art, a residual charge may remain in the integration capacitor 22 after folding operations have been completed. This residual charge, which is a charge portion that is less than the predetermined quantity of charge removed in each folding cycle, can be quantized by a residue quantizing circuit 58, such as exemplified by a fully differential comparator stage 350 shown in FIG. 17. The residue quantizing circuit 58 may provide to the digital output signal one or more additional digital bits corresponding to the residual charge.

The capacitance-based folding method disclosed herein offers several advantages over a conventional current-based folding process. For example, the direction of thermal drift in a capacitance-based folding circuit is the same for all capacitors, whereas the direction of thermal drift is random in a current-based folding configuration. Moreover, capacitance-based folding provides a lower intrinsic thermal capacitor drift, about +25 ppm/degree C. as compared to about ±100 ppm/degree C. for a standard current source. In addition, capacitance-based performance is not impacted by switch parasitics, which may be on the order of about 30 fF. Thus, a capacitance-based folding circuit is less sensitive to the switching edges in a timing sequence because the circuit operates using the relationship of $Q_{FOLD} = C*V$ and is, accordingly, time independent. However, accuracy of circuit operation can be controlled by changing the time interval of the charge and fold periods. Advantageously, as described in greater detail below, the charging process can be made fully differential.

Figure 5:
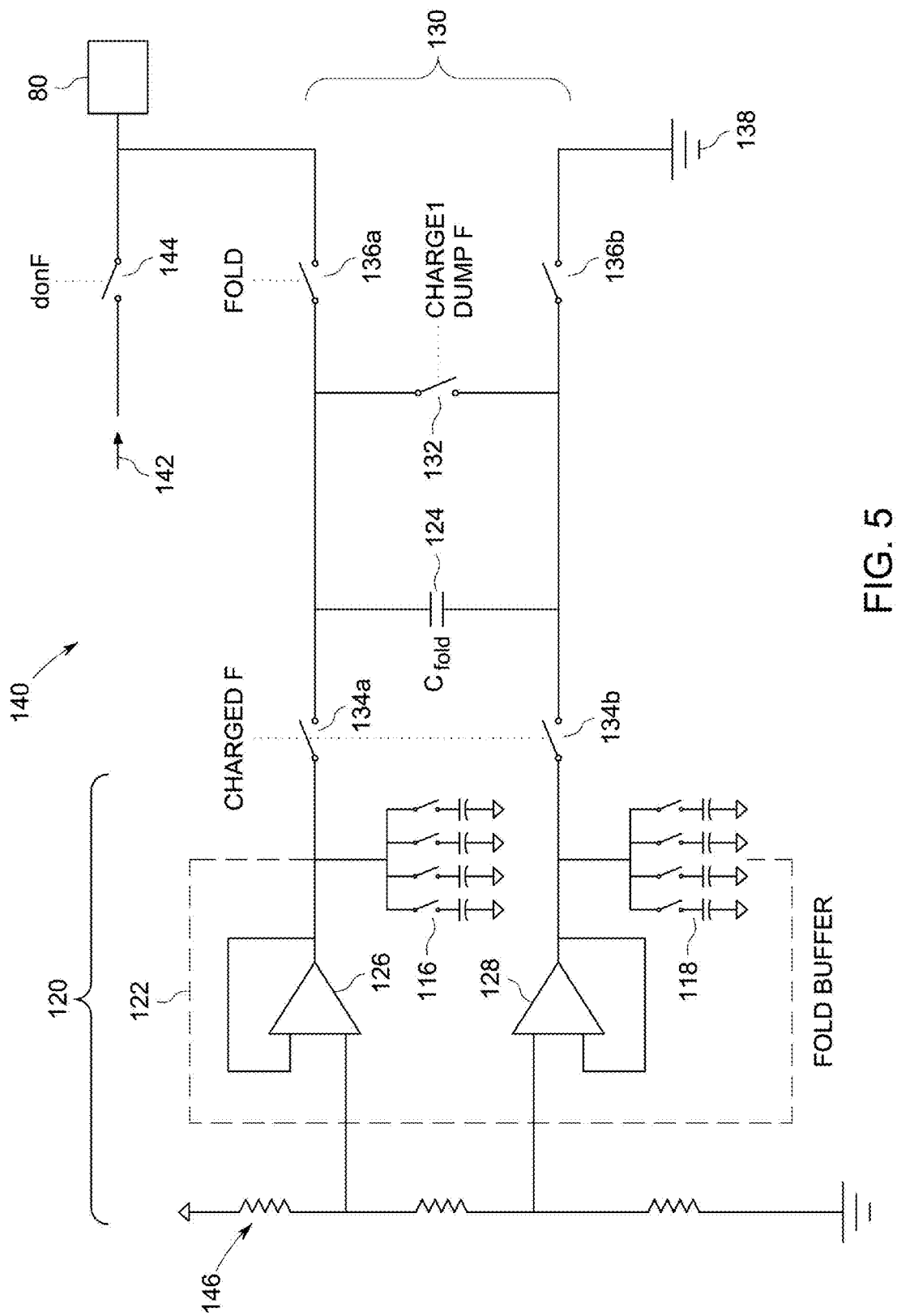
FIG. 5 is a simplified schematic showing switches and components configured for use in a capacitance-based folding circuit.

FIG. 5 shows a simplified schematic illustrating a portion of an exemplary embodiment of a multi-channel capacitance-based charge to digital converter 120. In the configuration shown, a common fold buffer 122 includes fold buffers 126 and 128, and corresponding buffer compensation capacitor arrays 116 and 118. The common fold buffer 122 and an associated voltage divider 146 may be shared across a plurality of converter channels disposed on a multi-channel chip (not shown), of which a representative converter channel 140 is shown. The converter channel 140 includes a capacitance-based fold channel 130, the sensor input switch 144, and an integration circuit, such as the integration circuit 80, for example. The capacitance-based fold channel 130 includes a fold capacitor 124 ($C_{FOLD}$) connected to the common fold buffer 122 via a first charge switch 134a and a second charge switch 134b.

Each of the plurality of fold channels on the multi-channel chip is similarly configured to the capacitance-based fold channel 130 shown, and each of the plurality of fold channels (not shown) includes a corresponding fold capacitor selectively connected to the common fold buffer 122 via a corresponding charge switch pair, similar to the charge switch pair 134a and 134b. Within each fold channel, input from a corresponding sensor, such as the charge input 142, is provided via a sensor input switch, such as the sensor input switch 144.

The capacitance-based fold channel 130 may also include a charge dump switch 132 across the fold capacitor 124. The capacitance-based fold channel 130 may additionally include a first fold switch 136a, that can be closed to couple one end of the fold capacitor 124 to an integration circuit, such as the integration circuit 80 shown in FIG. 3.

Similarly, a second fold switch 136b may be provided, that can be closed for discharging the fold capacitor 124 to a circuit ground 138. Each compensation capacitor in the compensation capacitor array 116 has one end coupled to ground, as shown, and another end switchably connected to an output of the fold buffer 126. The compensation capacitor arrays 116 and 188 are connected to fold buffers 126 and 128, respectively, to maintain amplifier stability whenever the two fold buffers 126 and 128, in the multi-channel capacitance-based charge to digital converter 120, are disconnected from a the fold capacitors 125 in the plurality of capacitance-based fold channels, such as capacitance-based fold channel 130.

Figure 6:
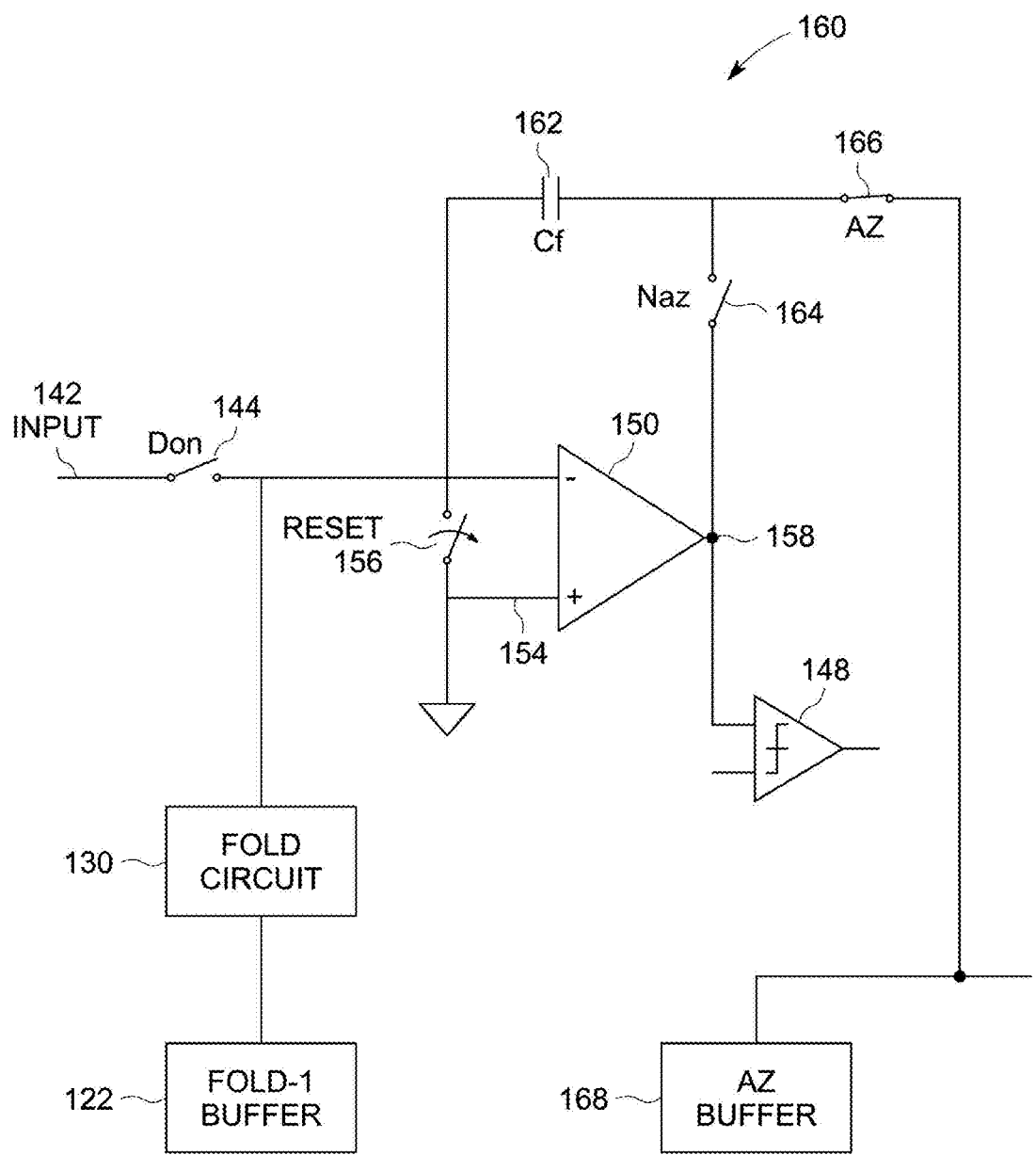
FIG. 6 shows a common fold buffer adapted for use with a plurality of capacitance-based folding circuits.

As shown in FIG. 6, an auto-zeroing and integration stage 160 comprises an integrating capacitor 162 ($C_F$) connected across a single ended OTA 150. The charge input 142 may be provided via the sensor input switch 144 ($D_{ON}$) to an inverting input 152 of the OTA 150 depending on the position of an input reset switch 156. A non-autozeroing switch 164 (Naz) may be provided between the integrating capacitor 162 and an output terminal 158 of the OTA 150. An auto-zeroing switch 166 (AZ) may be provided between the integrating capacitor 162 and a common auto-zeroing buffer 168, where the common auto-zeroing buffer 168 is also connected to the plurality of fold channels, as is the common fold buffer 122. A voltage comparator 148 may be provided at the output terminal 158 for detection of charge flow. Note that the fold buffer 122 and the auto-zeroing buffer 168 may be common to one or more fold stage channels, where each fold stage channel comprises the remaining components shown in the illustration.

Figure 7:
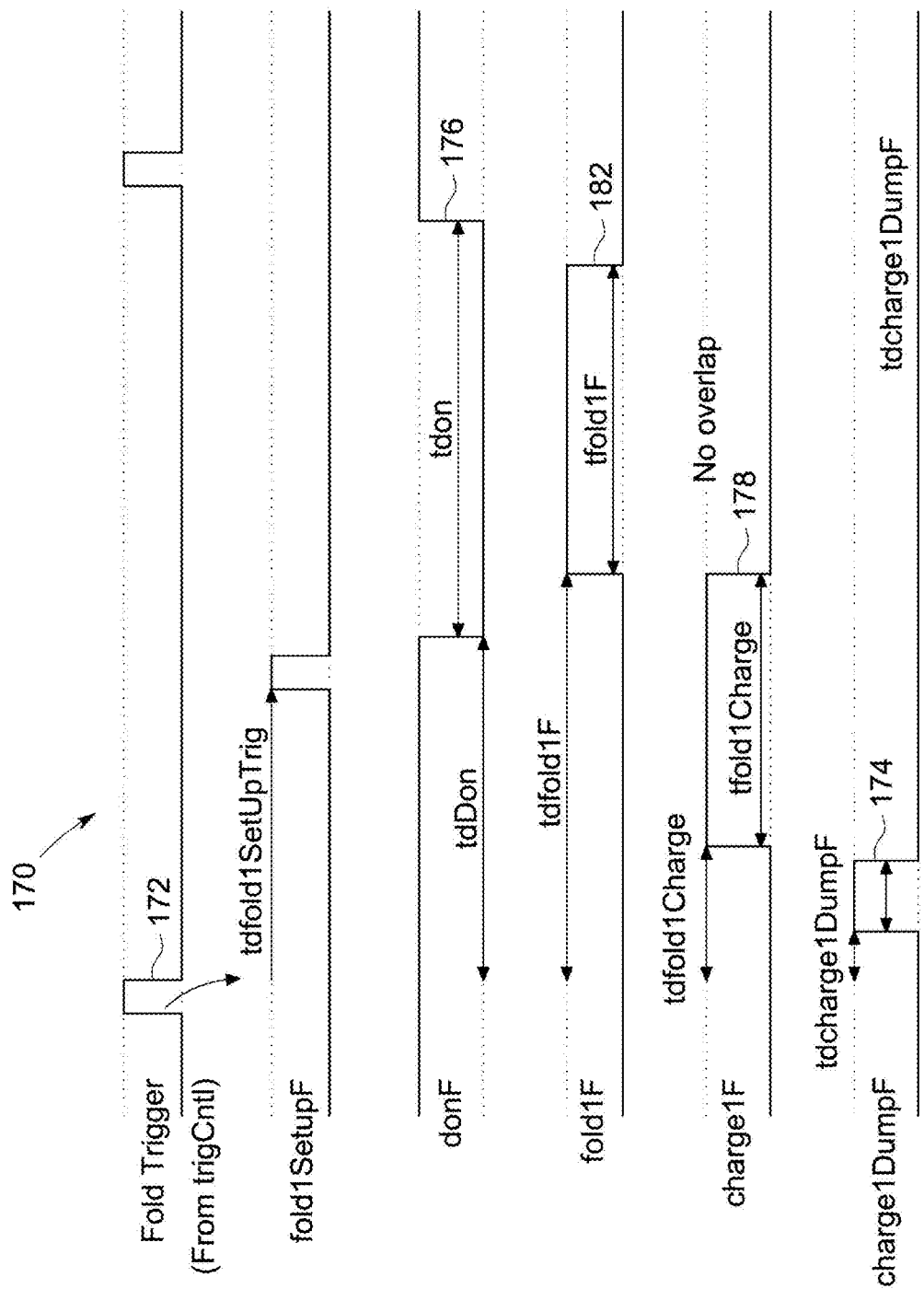
FIG. 7 is a fold timing diagram for the switches and components in the circuit of FIG. 5.

A timing diagram 170, shown in FIG. 7, illustrates operation of the autozeroing and integration stage 160 of FIG. 6. A "fold trigger" pulse 172 initiates the capacitance-based charge and fold process. In an exemplary embodiment, with additional reference to FIG. 5, the charge cycle begins with the same initial condition on the fold capacitor 124. This can be achieved by resetting the fold capacitor 124 to a predetermined fold charge level before every charge is done. A "charge1DumpF" pulse 174 is sent to the charge dump switch 132 that serves to short the fold capacitor 124 to the ground 138 before each charge cycle.

A "donF" signal 176 may be kept high to retain the sensor input switch 144 in a closed state and provide a "charge1F" charge signal 178 to pre-charge the fold capacitor 124. After a first predetermined length of time, denoted in the timing diagram 170 as "tdDon," charging of the fold capacitor 124 may be terminated, and after a second predetermined length of time, denoted in the timing diagram 170 as "tdfold1F," the accumulated charge may be folded to an integration circuit (i.e., exemplified by the OTA 150 and the fold capacitor 124 $C_F$), for a predetermined length of time as indicated by a "fold1F" signal 182. It should be noted that, in an exemplary embodiment, there is no overlap between the high "charge1F" signal 178 and the high "fold1F" signal 182.

In an alternative exemplary embodiment, the fold capacitor 124 may be pre-charged locally to eliminate the need for the common fold buffer 122 to slew some or all of the plurality of fold channels in a multi-channel configuration. In such embodiments, only a small signal settling would be required. In yet another alternative exemplary embodiment, the buffer compensation capacitors 116 and 118 can be disconnected several nanoseconds after the charging of the fold capacitor 124 has begun. With this delay, a "charge kick" can be provided to the fold capacitor 124 so as to reduce the time required to slew, and to speed the small signal settling.

The process of capacitance-based charging or folding may be seen as comprising three operating phases. In a first operating phase, the "charge1F" signal 178 closes the first charge switch 126 and the second charge switch 128 that thereby enable the charges stored in the buffer compensation capacitors 116 and 118 to charge the fold capacitor 124. Charging of the fold capacitor 124 continues until the charge is equalized across the buffer compensation capacitors 116 and 118 and the fold capacitor 124. This occurs over a very short period of time, typically less than five nanoseconds. Using the charge from the common fold buffer 122 thus reduces the amount of slew time required for charge equalization.

In a second operating phase, buffer slewing occurs where the fold buffer 122 is charging the compensation capacitors 116 and 118 and the fold capacitor 124. In a third operating phase, a small signal is used to settle the desired voltage and accuracy. When a plurality of the fold capacitors 124 are connected to the fold buffer 122, the fold buffer 122 may become loaded and may not require a compensation capacitor for stability. It has been observed that keeping the buffer compensation capacitor arrays 116 and 118 connected may slow the small signal settling.

In an alternative embodiment, therefore, the buffer compensation capacitor arrays 116 and 118 may be disconnected a few nanoseconds after the charge cycle has started so as to enable the buffer compensation capacitor arrays 116 and 118 to charge the fold capacitors 124 in the various channels. This may allow for the slew time to be reduced, and optimizes the small signal settling. In an alternative exemplary embodiment, a buffer compensation capacitor can be separated into a static compensation capacitor and a dynamic compensation capacitor, where the static compensation capacitor may remain connected while the dynamic compensation capacitor may be released after the fold capacitor charging has begun.

Figure 8:
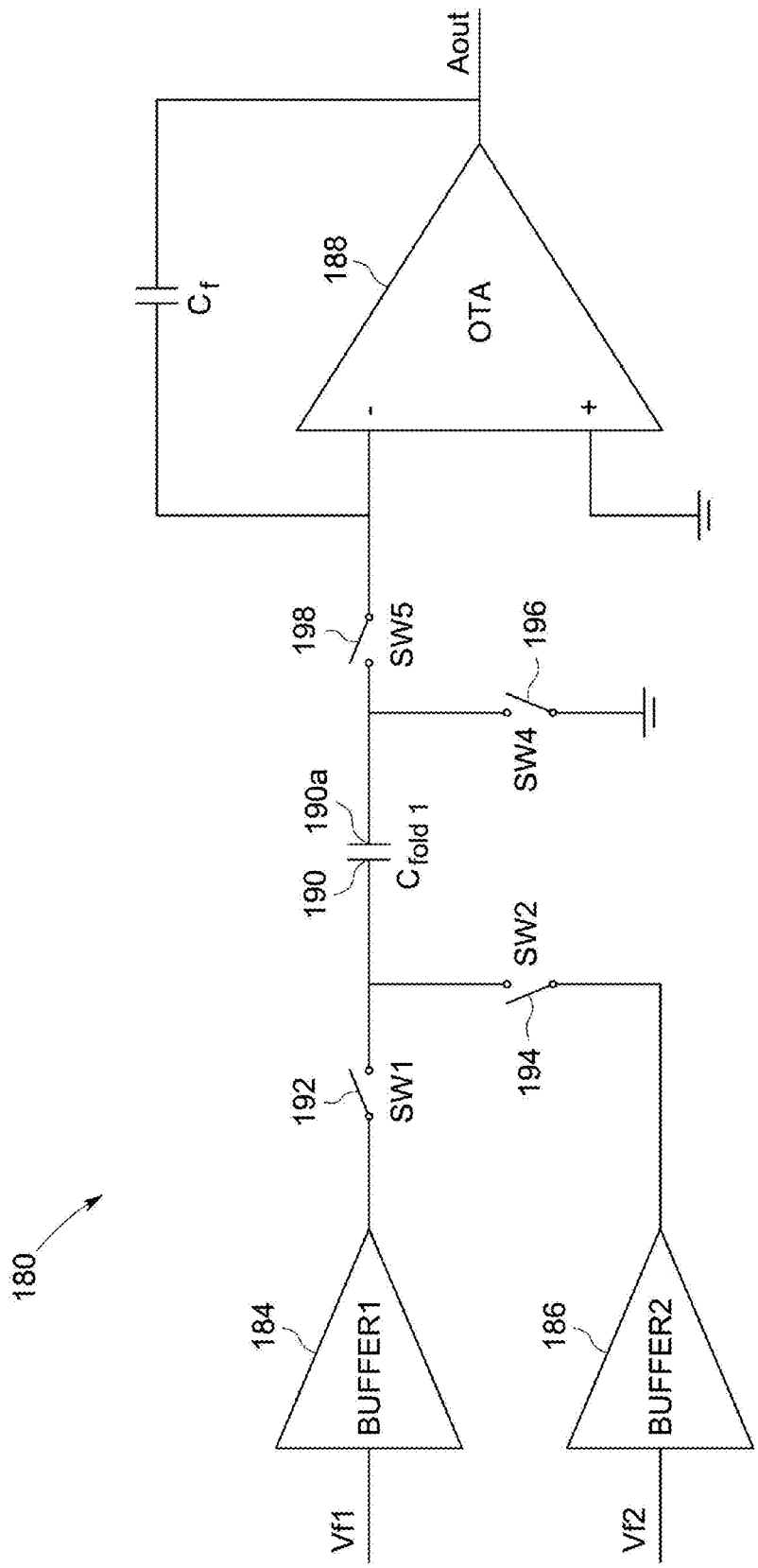
FIG. 8 is a simplified schematic showing a method of parasitic capacitance insensitive fold configured for use in a capacitance-based folding circuit, in an exemplary embodiment of the invention.

In yet another alternative exemplary method of charging and discharging a fold capacitor, shown in FIG. 8, a method of parasitic insensitive charging may be used to reduce the impact of unwanted, but unavoidable, parasitic capacitors. The charge polarity voltage can be reversed to create a negative fold in either a single-ended or a differential folding circuit, without changing the charging mechanism or the folding mechanism. The negative fold can be used to enable a channel offset, or to receive a reversed input current from a sensor diode. Alternatively, fold switches can be crossed instead of changing the voltage polarity. By crossing the fold switches, the revised buffer design may not require such a large voltage range.

Figure 9:
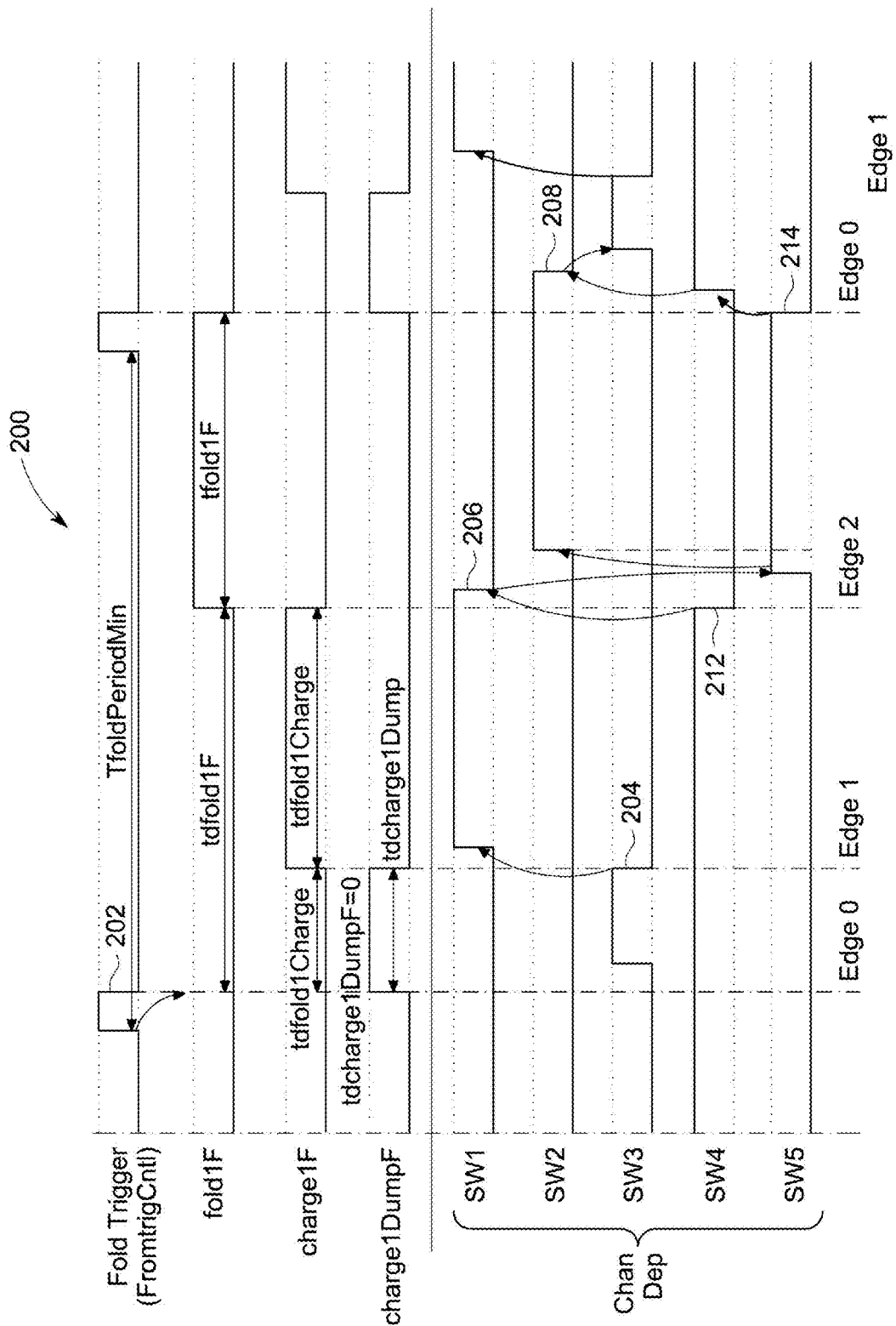
FIG. 9 is a fold timing diagram for the parasitic insensitive folding circuit of FIG. 8.

A simplified parasitic insensitive folding circuit 180 is shown, operating in accordance with a timing diagram 200, shown in FIG. 9. In the parasitic insensitive folding circuit 180, the voltage present on a first node 190a of a fold capacitor 190 is preferably maintained at substantially ground potential. In this configuration, fold switches 198 (SW5) and 194 (SW2) implement the "fold phase," in accordance with SW5 signal 214 and SW2 signal 208. Switches 196 (SW4) and 192 (SW1) implement the "charge phase," in accordance with SW4 signal 212 and SW1 signal 206. The four switches SW1, SW2, SW4, and SW5, in the parasitic insensitive folding circuit 180 may be used to switch between positive and negative folding. Combining switches SW1 and SW4 in charge phase, and switches SW2 and SW5 in fold phase may give a positive fold; while combining switches SW2 and SW4 in charge phase, and switches SW1 and SW5 in fold phase may give a negative fold.

Figure 10:
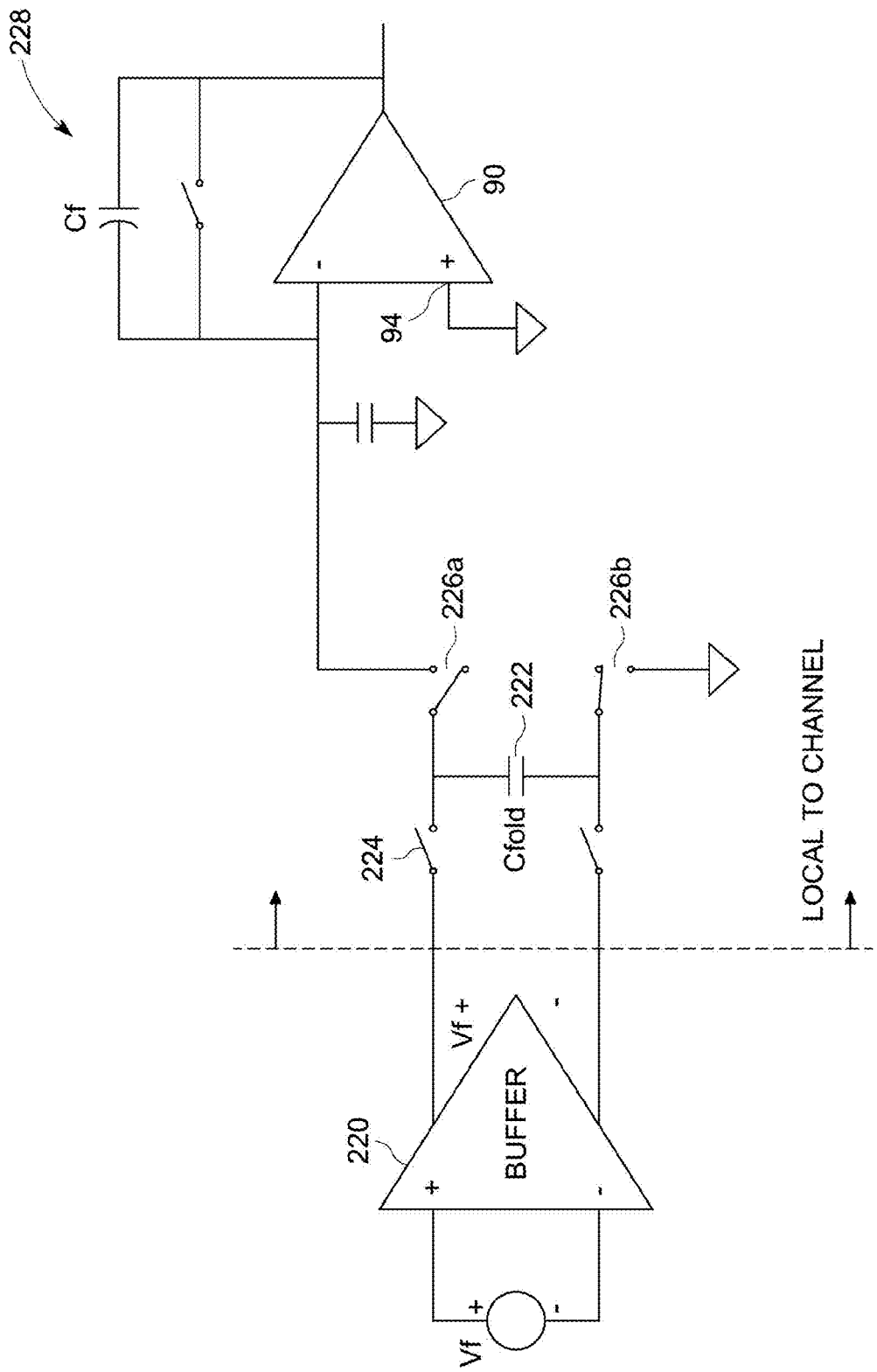
FIG. 10 is a simplified schematic showing a fully differential charge circuit configured for use in a capacitance-based folding circuit, in an exemplary embodiment of the invention.

In an alternative exemplary embodiment, shown in FIG. 10, a fully differential voltage buffer amplifier 220, functioning as a fold buffer, can be used to charge, in a fully differential manner, a plurality of fold capacitors in respective folding channels, exemplified by a fold capacitor ($C_{fold}$) 222. Although sensitivity to parasitics on the fold capacitor 222 may not be minimized using the differential voltage buffer amplifier 220, a charging interconnect 224 disposed between the outputs of the differential voltage buffer amplifier 220 and the corresponding fold capacitor 222 in each channel is fully differential. Folding switches 226a and 226b may be provided to transmit charge to a channel integration circuit 228. The configuration of the fully differential voltage buffer amplifier 220 may thus be used to provide parasitic insensitive charging and folding.

Figure 11:
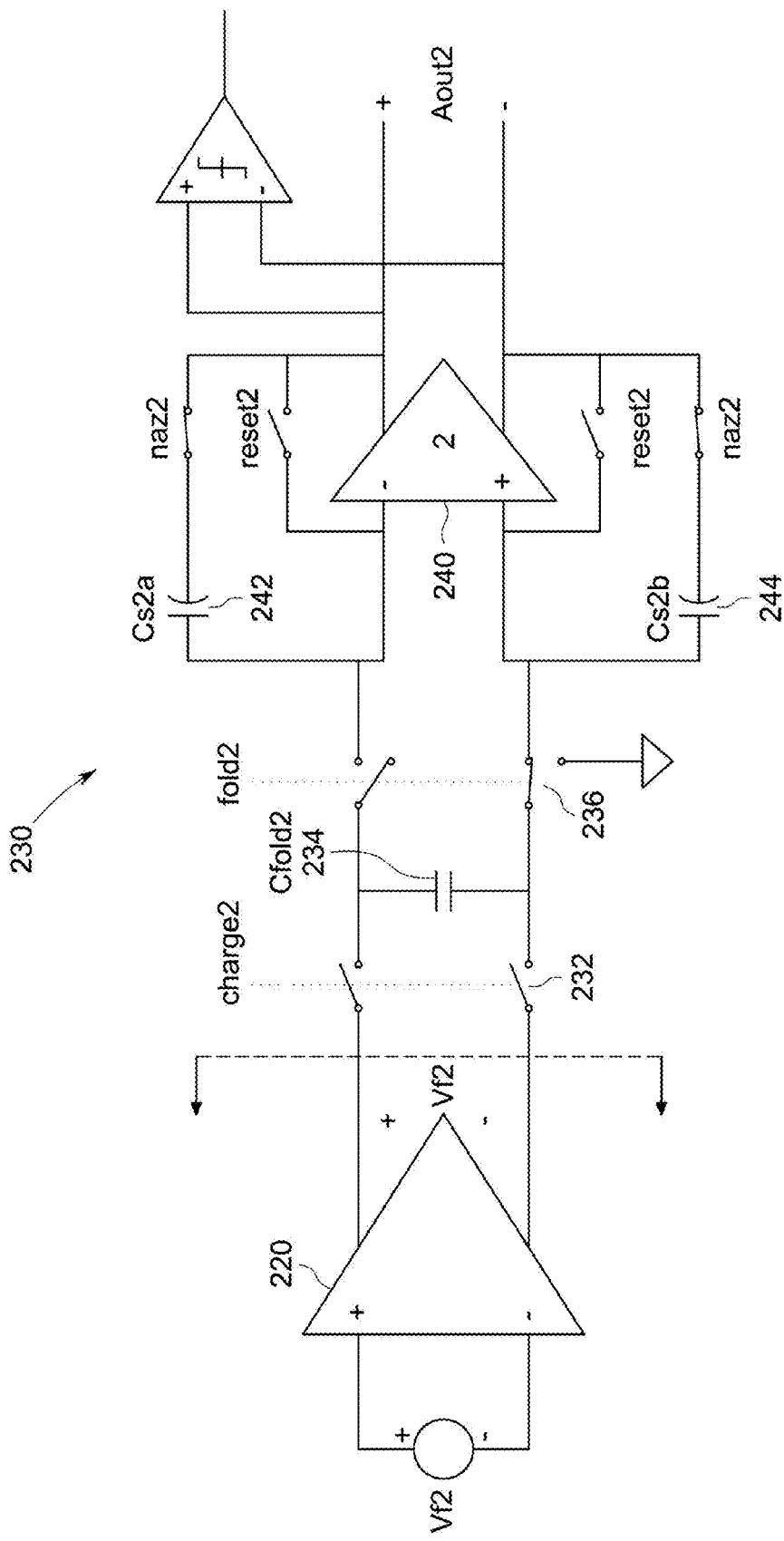
FIG. 11 is a simplified schematic showing a fully differential charge and fold circuit configured for use in a capacitance-based folding circuit, in an exemplary embodiment of the invention.
Figure 12:
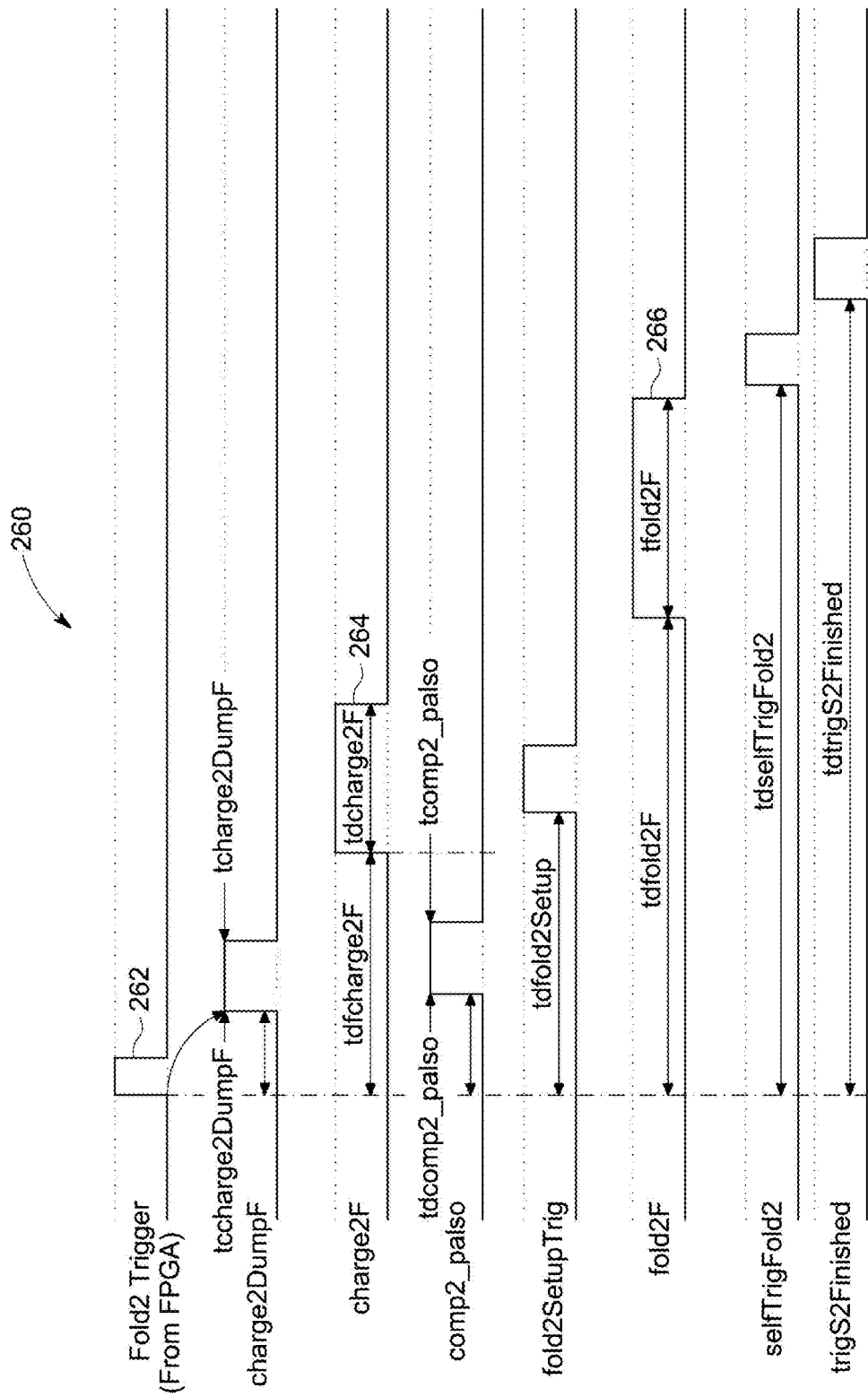
FIG. 12 is a timing diagram for the fully differential charge and fold circuit of FIG. 11.

In still another exemplary embodiment, shown in FIG. 11, a fully-differential capacitance-based integrate and fold circuit 230 is configured to provide a capacitive fold into a fully differential OTA 240, in accordance with a timing diagram 260, shown in FIG. 12. The fully differential OTA 240 includes a first integrating capacitor 242 ($C_{S2A}$) across an inverting input and an output of the OTA 240, and a second integrating capacitor 244 ($C_{S2B}$) across a non-inverting input and an output. A predetermined time "tdfcharge2F" after a fold trigger 262 is received from a fold logic circuit (not shown), a "charge2F" signal 264 is sent to close a "charge2" switch 232 and charge a fold capacitor 234 to a voltage potential having a value of $V_{CHARGE}$.

When the fold process is requested, per a "fold2F" signal 266, a "fold2" switch 236 may be closed and the fold capacitor 234 may be discharged. Subsequent charge equalization between the fold capacitor 234 and the integrating capacitors 242 and 244, creates a change in the differential output voltage $\Delta A_{OUT2(DIFF)}$ of the OTA 240, as given by equation (2):

$$\Delta A_{OUT2(DIFF)} = -2V_{CHARGE} \frac{C_{FOLD2}}{C_{S2}} \quad (3)$$

where $A_{OUT2(DIFF)}$, the residue at the end of the integration in the folding circuit 230, is:

$$A_{OUT2(DIFF)} = \frac{I_D t_{VIEW}}{C_{f1}} - 2V_{CHARGE} \frac{C_{FOLD2}}{C_{S2}} n_{FOLD2} \quad (4)$$

It can be appreciated by one skilled in the art that the differential capacitance-based folding circuit 230 provides a system that is fully differential, a characteristic that increases immunity to common mode power, ground, and signal disturbance. Note that the fold size depends on virtual ground and not on a system ground. A fully differential operational amplifier may require a control loop to ensure that the common mode signal does not drift out of the useful range of the differential operational amplifier. This is normally accomplished by monitoring the outputs of the differential operational amplifier and providing as feedback a control signal to ensure that the common mode output voltage meets a desired value. This "output common mode control" locks in the output common mode. In the example provided, the input common mode is a function of the charges on the integration capacitors 242 and 244, and the output common mode.

Figure 13:
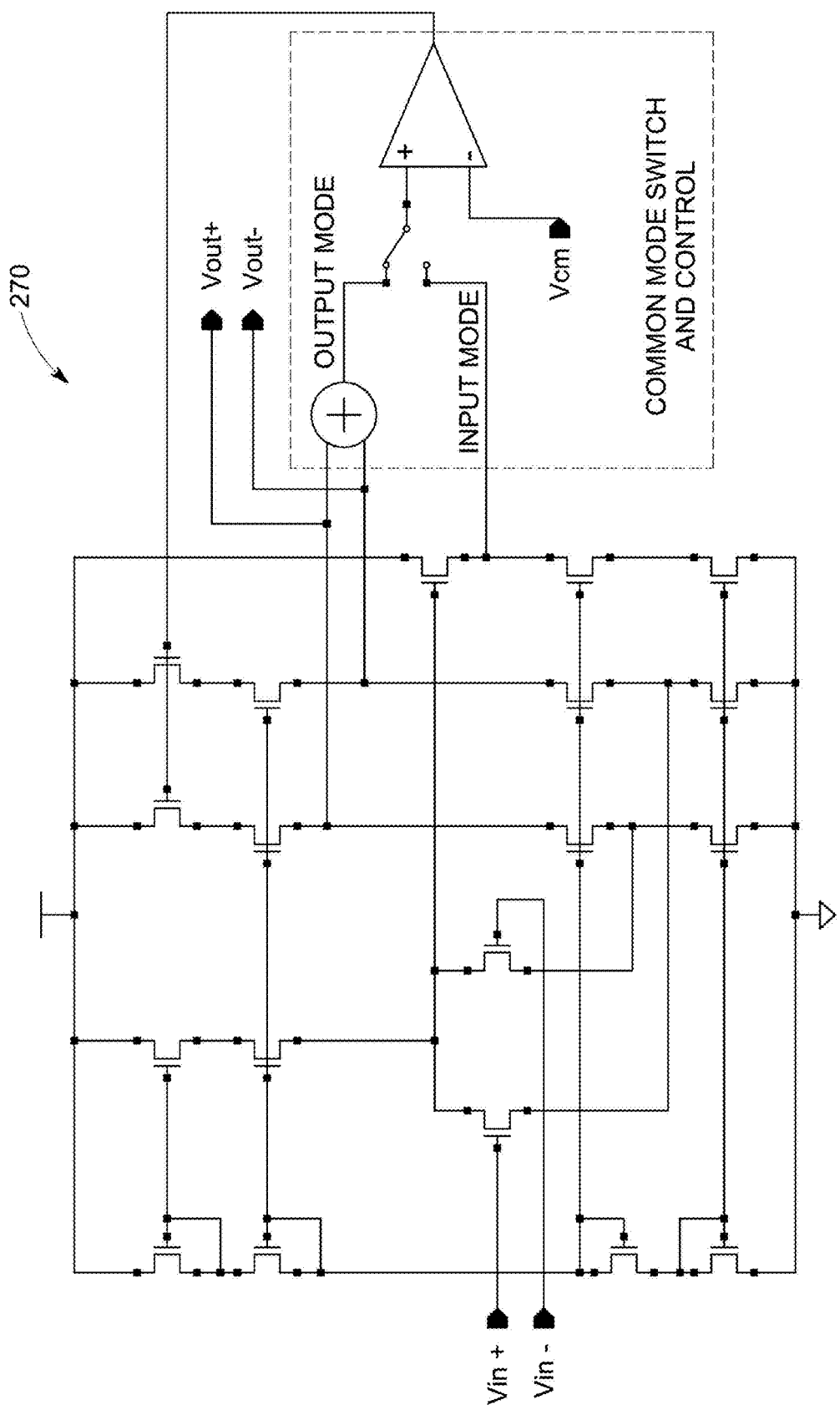
FIG. 13 is switching network functioning to select either input or output common mode control.

In yet another exemplary embodiment, control is provided for the common mode of the input terminals of the fully differential OTA 240, as both the input common mode and the output common mode cannot be controlled simultaneously. When the input common mode is tracked, every fully differential fold sees the same input common mode voltage, regardless of the input signal. This reduces the impact of parasitics and in turn improves signal linearity. An input common mode control that monitors the common source connection of the input differential pair can be used. In a pipelined system, it is advantageous to use input common mode control during folding, and output common mode control when sampling voltage from the OTA 240 output onto a proceeding stage. This may be accomplished by adding a switching network that selects either input or output common mode control, as exemplified by a common mode control circuit 270 shown in FIG. 13.

Figure 14:
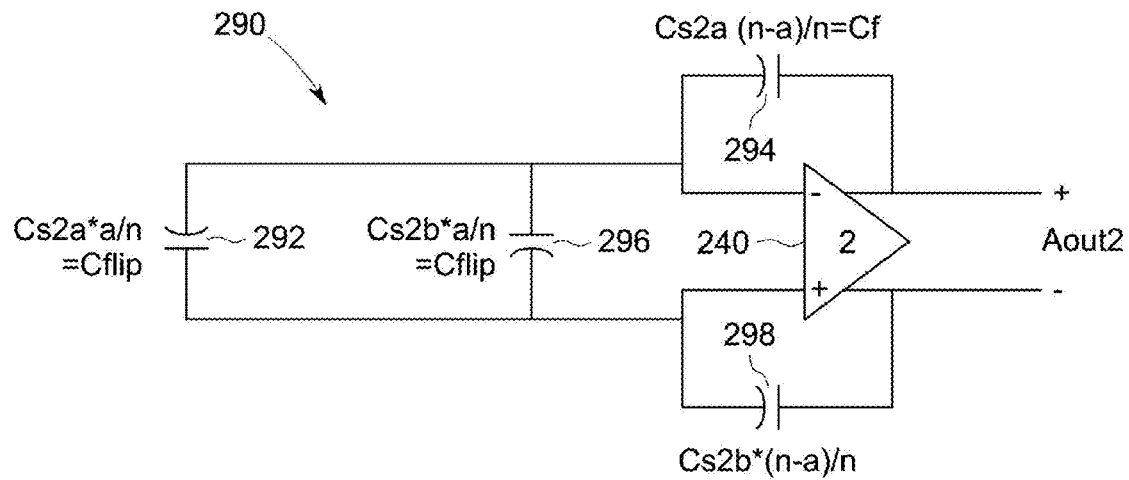
FIG. 14 is a simplified schematic showing an alternative exemplary embodiment of the fully differential charge and fold circuit of FIG. 11, after reconfiguration of feedback capacitors.

In a pipelined converter, the fully differential fold can be used to resolve input from a preceding stage by subtracting from the voltages across the integration capacitor 242 or the integration capacitor 244, shown in FIG. 11, until the differential output voltage is reduced to a level that is defined by the fold size. At that point the differential output voltage should be relatively small. It may then be possible to boost the output voltage by taking portions of either or both the integration capacitors 242 and 244 and reconfiguring, or "flipping," the portions into the input path to provide a "flip capacitor," as shown in greater detail in the simplified circuit diagram 290 of FIG. 14.

Figure 15:
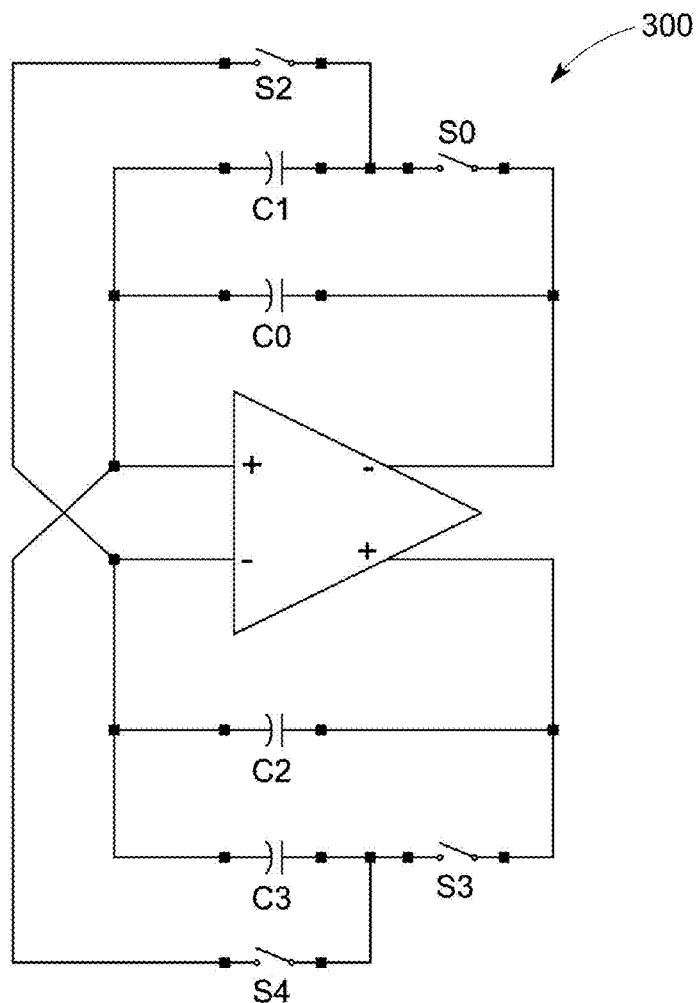
FIG. 15 is a simplified schematic showing a method of using switches to disconnect feedback capacitors from an operational transconductance amplifier output and to reconnect across the operational transconductance amplifier input terminals.

The simplified circuit diagram 290 shows that, to provide a first flip capacitor 292, the integration capacitor 242 ($C_{S2A}$), of FIG. 11, has been "broken" into "n" parts. Likewise, to provide a second flip capacitor 296, the integration capacitor 244 ($C_{S2B}$) has been "broken" into "n" parts. An $$\frac{n-a}{n}$$

portion 294 of the integration capacitor 242 remains connected from an inverting input terminal of the OTA 240 to an output terminal, and an $$\frac{n-a}{n}$$

portion 298 of the feedback capacitor 244 remains connected from a non-inverting input terminal of the OTA 240 to the output terminal. An a/n portion 292 of the feedback capacitor 242 and an a/n portion 296 of the feedback capacitor 244 are disconnected from outputs of the OTA 240, and may then be reconnected across the input terminals, using switches as shown in a circuit 300 in FIG. 15.

The charge stored on a $C_{S2}$ capacitor is "squeezed out" and integrated on the remaining integration capacitor. The voltage gain ($A_{OUT2(DIFF)}$) is given by equation (5). By increasing the voltage at the output of the differential stage, subsequent stages will see larger voltages that, in turn, may accommodate processing components with less performance resolution.

$$A_{OUT2(DIFF)} = \left( \frac{I_D t_{VIEW}}{C_{f1}} - 2V_{CHARGE} \frac{C_{FOLD2}}{C_{S2}} n_{FOLD2} \right) \frac{2C_{FLIP} + C_f}{C_f} \quad (5)$$

Figure 16:
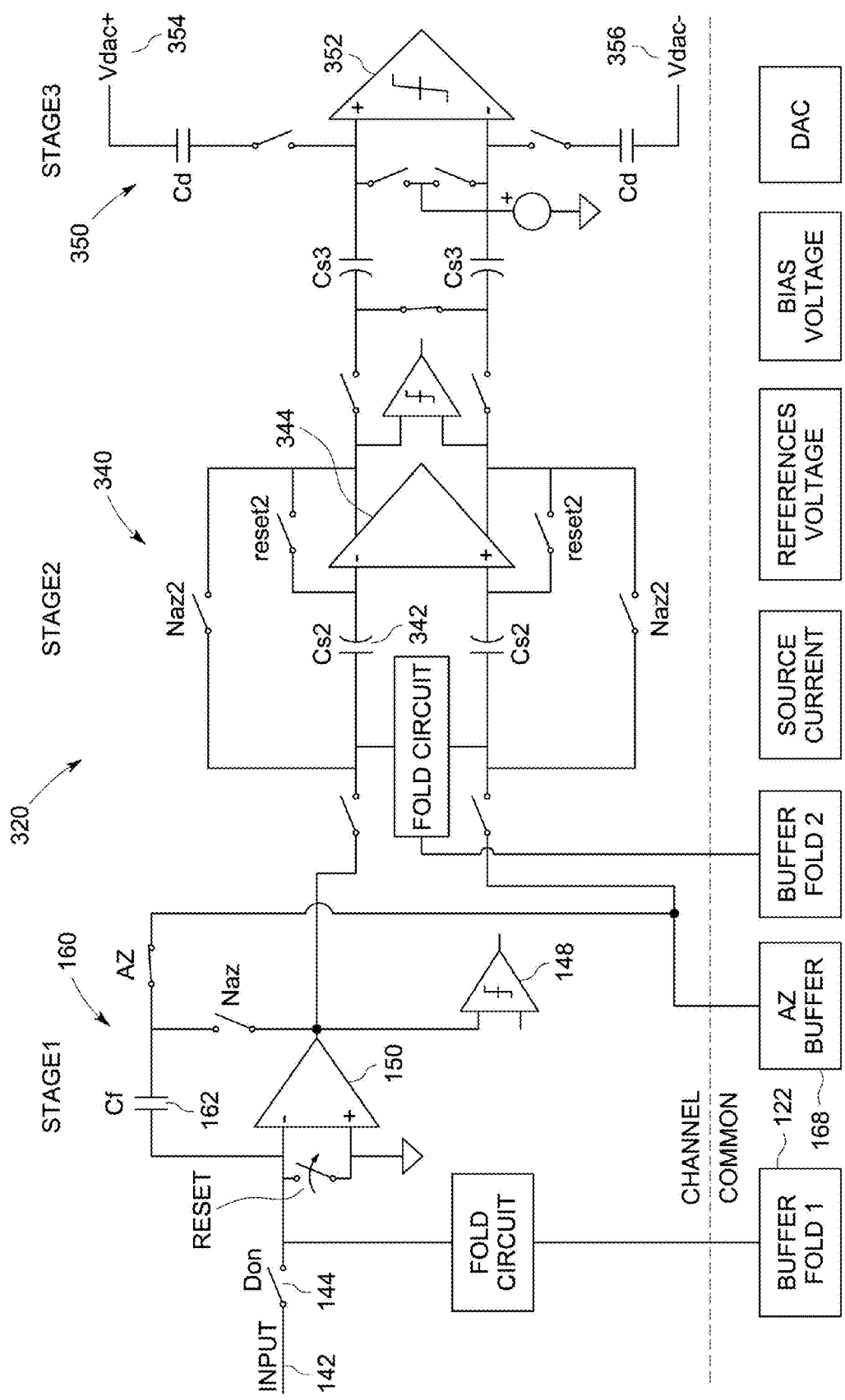
FIG. 16 is a simplified high-level schematic showing a pipelined charge-to-digital channel, configured into three stages of channel operation and adapted for use in a capacitance-based folding circuit, in an exemplary embodiment of the invention.

There is shown in FIG. 16, a simplified high-level schematic diagram of an exemplary embodiment of a pipelined analog-to-digital (A/D) channel 320, here configured into three stages of channel operation. In the auto-zeroing and integration stage 160 of the A/D channel 320, the charge input 142 from the external sensor (not shown) may be input, via the sensor input switch 144 ($D_{ON}$), to an integrator formed by the single ended OTA 150 and the integration capacitor 162 ($C_F$). The auto-zeroing and integration stage 160 comprises an AZ switch and AZ buffer combination. When charge on the integration capacitor 162 reaches a pre-determined level, the voltage comparator 148 fires, resulting in a request for a first stage folding operation. The first stage folding operation functions to remove accumulated charge from the integration capacitor 162 for a predetermined folding period, and then allows the integration capacitor 162 to continue filling. The A/D channel 320 may track the number of first stage folding operations performed to provide a corresponding fold count.

Once the integration period is complete, the sensor input switch 144 opens, and the charge remaining on the integration capacitor 162 is provided to and sampled in a fully differential charge and fold stage 340 of the A/D channel 320. The charge gain desired for the fully differential charge and fold stage 340 can be controlled by selecting the value of a second-stage feedback capacitor 342 ($C_{S2}$) relative to the value of the integration capacitor 162. The input to the charge and fold stage 340 of the A/D channel 320 is the voltage stored on the integration capacitor 162. After auto-zeroing has been performed, the differential voltage at a second stage OTA 344 will be ($V_{AZ}-A_{OUT1}$) where $A_{OUT1}$ is linearly proportional to the accumulated charge (i.e., residue) remaining in the integration capacitor 162 at the end of the first-stage integration period.

This maximum voltage is bounded so that it lies within the input range of the charge and fold stage 340 of the A/D channel 320. Fully differential folds are used to reduce this input voltage to a target voltage level defined by the second stage OTA 344. In general, the target voltage level will be determined when the differential output changes polarity. Once folding is completed, capacitor flipping is used to amplify the voltage, as described above. During the capacitor flipping operation, the second stage OTA 344 may be switched from input common mode control (see FIG. 13) to output common mode control.

A fully differential comparator stage 350 of the A/D channel 320 may comprise a voltage comparator 352 to sample any residue voltage that may be provided from the charge and fold stage 340. A first ramp 354 ($V_{DAC+}$) may be input to the comparator stage 350 of the A/D channel 320 at a voltage comparator non-inverting input and a second ramp 356 ($V_{DAC-}$) may be input to the comparator stage 350 at a voltage comparator inverting input. The time taken for the voltage comparator 352 to change state during ramping is proportional to the output voltage from the charge and fold stage 340. A DAC (not shown) of an arbitrary voltage can be used to drive the voltage comparator inputs using methods described above.

As can be appreciated by one skilled in the art, if a folding operation is executed in the auto-zeroing and integration stage 160 of the A/D channel 320 with the sensor input switch 144 opened, it is possible to do additional folding between the times that the sensor input switch 144 opens and the sampling begins in the charge and fold stage 340 of the A/D channel 320. In general, the fold size and the input of the autozeroing and integration stage 160 will be greater than that of the charge and fold stage 340. By executing an additional fold, the size of the residue in the auto-zeroing and integration stage 160 may be reduced, which in turn may reduce the amount of work required by the charge and fold stage 340.

It should be understood that the charge and fold stage 340 and the comparator stage 350 of the A/D channel 320 can be shared across multiple channels (not shown). This configuration can be realized with a multiplexing operation and sample-and-hold circuit (not shown) to control when the charge and fold stage 340 and the comparator stage 350 begin the conversion process for a given sensor input. Moreover, if the AZ buffer 168 is shared by both the auto-zeroing and integration stage 160 and the charge and fold stage 340 for a given channel, as shown, the AZ operation of the charge and fold stage 340 may subtract out low frequency noise previously sampled during the AZ phase of the auto-zeroing and integration stage 160.

Figure 17:
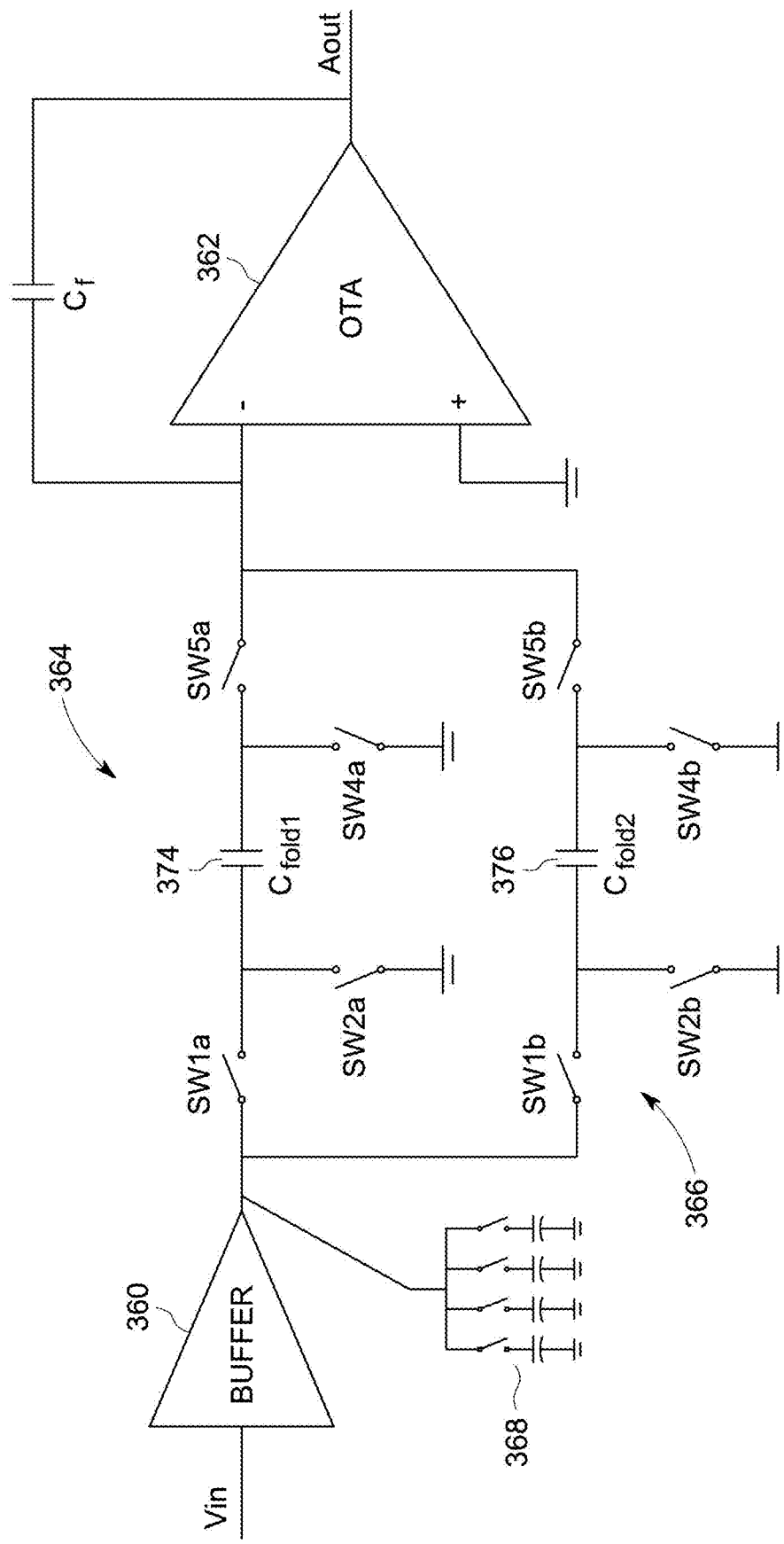
FIG. 17 is a simplified schematic showing a double charging and folding circuit configured for use in a capacitance-based folding circuit, in an exemplary embodiment of the invention.

In an alternative method of the parasitic-insensitive charging process described above (with reference to FIGS. 8 and 9), a fold buffer 360, shown in an exemplary circuit in FIG. 17, may be switched to one or more capacitors in a compensation capacitor array 368 during a folding period, and typically remains idle until a charging request is activated. During the charging period, an OTA 362, here shown coupled to the fold buffer 360 through a first fold circuit 364, may remain idle. Both the fold buffer 360 and the OTA 362 typically comprise high-speed components and consume significant amount of power, even when in an idle mode. In order to improve the power efficiency, a second fold circuit 366 may be added between the fold buffer 360 and the OTA 362 in parallel to the first fold circuit 364. The second fold circuit 366 may comprise a plurality of switches (e.g., switches SW1b, SW2b, SW4b, and SW5b) and a second fold capacitor 376 ($C_{FOLD2}$) having the same component values as corresponding switches (i.e., switches SW1a, SW2a, SW4a, and SW5a) and a first fold capacitor 374 ($C_{FOLD1}$) in the first fold circuit 364.

Figure 18:
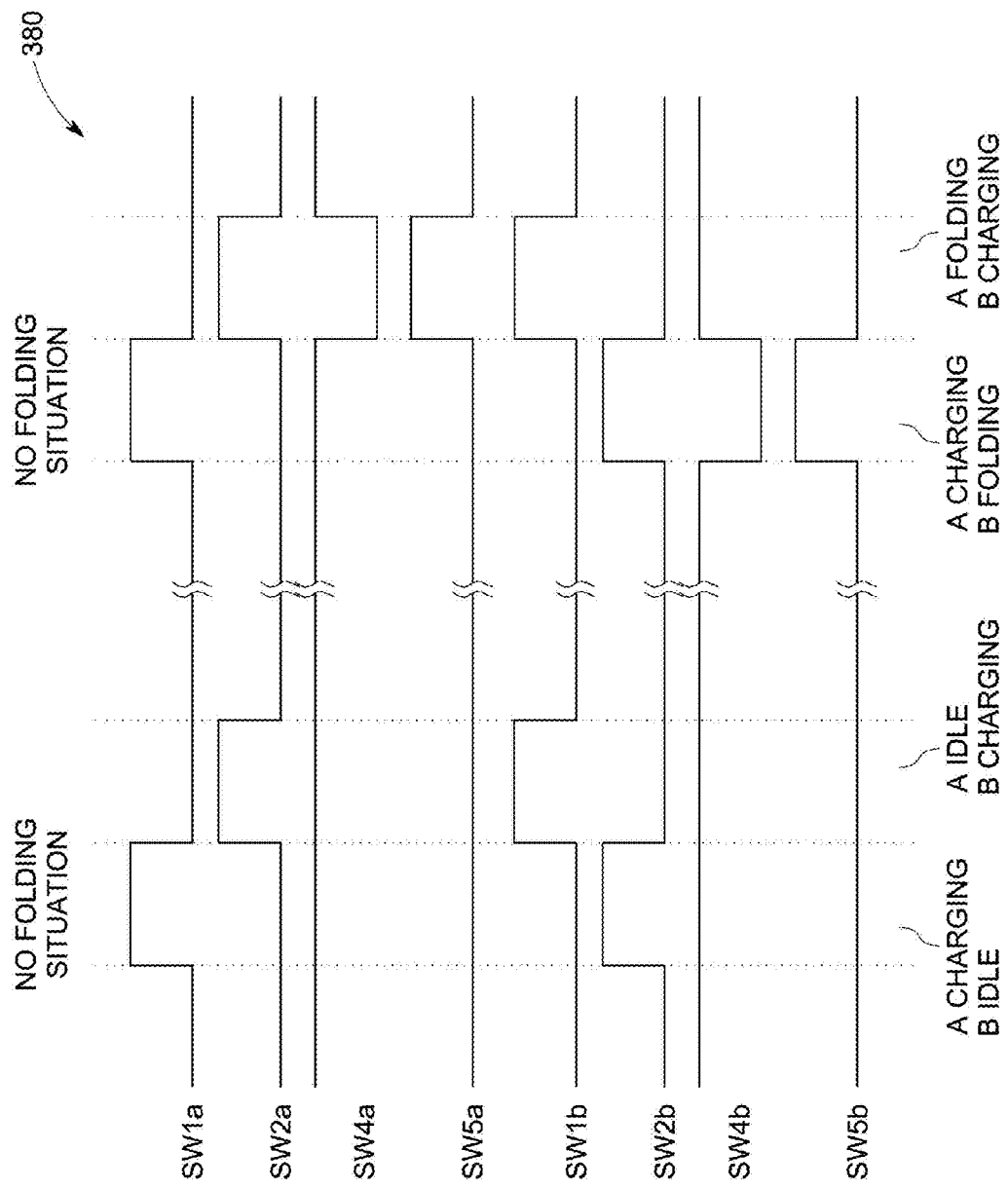
FIG. 18 is a timing diagram of the control logics for conducting switching operations in the circuit of FIG. 18.

With the configuration shown, the fold buffer 360 may function to charge the first fold capacitor 374 alternately with the second fold capacitor 376. Concurrently, the OTA 362 may function to execute a folding operation from the first fold capacitor 376 and alternating with the second fold capacitor 374. That is, when the first fold circuit 364 is in a fold mode, the fold buffer 360 may be charging the second fold capacitor 376, as illustrated in a timing diagram 380 shown in FIG. 18. In this way, the fold buffer 360 may be kept in essentially constantly operation and buffer idle time can be minimized. In an exemplary embodiment, a complete fold operation may comprise two consecutive smaller folds done by each of the first fold circuit 364 and the second fold circuit 366, in an operation that can be described a "double charging and folding" operation.

The double charging and folding method can provide several advantages. Folding speed is enhanced, and may be doubled, if one single fold size is kept the same. Larger input diode currents can be handled at the same speed, and up to twice as fast if one single fold size is kept the same. The double charging and folding method may provide for lower power consumption by the fold buffer 360, if a complete fold size is kept the same, whereby the power efficiencies of the OTA 362 and the fold buffer 360 may be improved.

Figure 19:
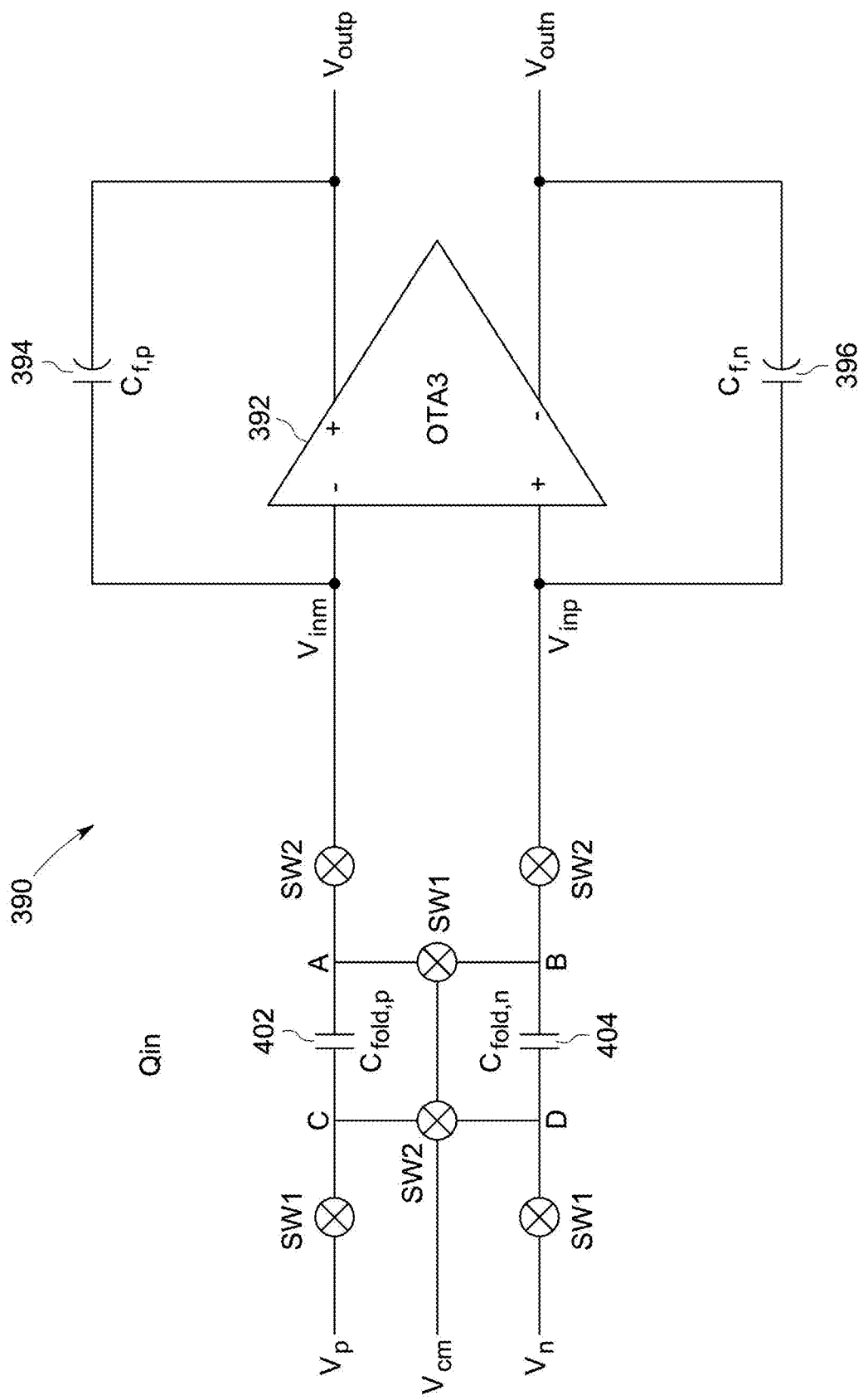
FIG. 19 is a simplified schematic of a fully-differential folding circuit and a plurality of switches adapted for use in a capacitance-based folding circuit.

Capacitance-based folding can also be used to generate a linear voltage ramp waveform suitable for use in the voltage comparator non-inverting input and in the voltage comparator inverting input, as shown above in FIG. 17. As shown in FIG. 19, a linear ramp waveform circuit 390 comprises an OTA 392 in a capacitive feedback configuration, with a first integration capacitor 394 ($C_{F,P}$) across the inverting input terminal of the OTA 392, and a second integration capacitor 396 ($C_{F,N}$) across the non-inverting input terminal of the OTA 392. The first integration capacitor 394 and the second integration capacitor 396 may be initialized to predefined voltages. The linear ramp waveform circuit 390 further comprises a first fold capacitor 402 ($C_{FOLD,P}$), a second fold capacitor 404 ($C_{FOLD,N}$), and a set of six switches grouped into two phases, gated by switches SW1 and SW2, respectively.

During a first phase of operation, the switches gated by SW1 may be turned "on" while switches gated by SW2 may be turned "off." The first fold capacitor 402 and the second fold capacitor 404 are charged to predefined voltages. In an exemplary embodiment, the first fold capacitor 402 ($C_{FOLD,P}$) may be charged up to the value ($V_P$-$V_{CM}$), while the second fold capacitor 404 ($C_{FOLD,N}$) may be charged up to the value ($V_{CM}$-$V_N$). The charges stored on the fold capacitor 402 and the fold capacitor 404 can be found from the expressions:

$$Q_{FOLD,P} = C_{FOLD,P} * (V_P - V_{CM}) \quad (6)$$

$$Q_{FOLD,N} = C_{FOLD,N} * (V_{CM} - V_N) \quad (7)$$

The equivalent total charge stored at the fold capacitors 402 and 404 across nodes C and D can be derived using equation (8):

$$Q_{TOTAL} = \frac{Q_{FOLD,P} + Q_{FOLD,N}}{2} = C_{FOLD} \times \frac{V_P - V_N}{2} \quad (8)$$

assuming $C_{FOLD,P} = C_{FOLD,N} = C_{FOLD}$.

During a second phase of operation, the switches gated by SW1 are turned "off," and the switches gated by SW2 are turned "on." In this way, the charges stored at the fold capacitors 402 and 404 are conserved. Because the OTA 392 is in a negative feedback loop, the voltage value $V_{INM}$ is substantially equal to the voltage value $V_{INP}$. Since node A is of the same voltage potential as $V_{INM}$ and node B is of the same voltage potential as $V_{INP}$, there is essentially no voltage difference across the fold capacitors 402 and 404. Thus, no charge will be held by the fold capacitors 402 and 404.

The previous stored charge may be conveyed onto the feedback capacitor, $C_F$, through the charging and discharging paths shown in FIG. 20. In accordance with Kirchoff's current law, the algebraic sum of currents entering any node is zero. Accordingly, charges on the feedback capacitor 394 ($C_{F,P}$) will be increased by amount of $Q_{TOTAL}$, while charges on the feedback capacitor 396 ($C_{F,N}$) will be decreased by amount of $Q_{TOTAL}$. This will translate into a voltage domain differential output step response. When the first phase of operation and the second phase of operation are repeated, the output of the OTA 392 will generate a voltage ramp waveform, until the voltage levels exceed the linear region of the OTA 392.

It can be appreciated by one skilled in the art that the linear ramp waveform circuit 390 utilizes a charge/fold mechanism to provide a linear voltage ramp, which matches the second stage of operation by tracking capacitor variation. The parasitic insensitive circuit 180, described above, avoids common mode voltage drift and provides a differential output.

While the invention is described with reference to several exemplary embodiments, it will be understood by those skilled in the art that various changes may be made and equivalence may be substituted for elements thereof without departing from the scope of the invention. In addition, many modifications may be made to the teachings of the invention to adapt to a particular situation without departing from the scope thereof. Therefore, it is intended that the invention not be limited to the embodiments disclosed for carrying out this invention, but that the invention includes all embodiments falling with the scope of the intended claims. Such other embodiments are intended to be within the scope of the claims if they have structural elements that do not differ from the literal language of the claims, or if they include equivalent structural elements with insubstantial differences from the literal languages of the claims.

What is claimed is:

1. A charge to digital converter comprising:
an integration circuit comprising an operational transconductance amplifier having an inverting input terminal and an output terminal, an integrating capacitor connected between said inverting input terminal and said output terminal, said integrating capacitor for storing a charge input selectively provided by a sensor diode; and
a folding circuit having a fold capacitor, said fold capacitor switchably coupled to a fold voltage source via a fold buffer for charging said fold capacitor to a predetermined fold charge value when said integrating capacitor stores said charge input selectively provided by the sensor diode, and said fold capacitor switchably decoupled from the fold voltage source and coupled to said integrating capacitor for selectively removing at least a portion of said stored charge input when said stored charge input exceeds a predetermined integration charge value.

2. The converter of claim 1 wherein said folding circuit further comprises said fold buffer disposed between said fold voltage source and said fold capacitor.

3. The converter of claim 1 further comprising a residue quantizing circuit coupled to said output terminal of said operational transconductance amplifier, said residue quantizing circuit providing at least one additional digital bit to a digital output signal, said at least one additional bit corresponding to a residual charge in said integrating capacitor.

4. The converter of claim 1 further comprising a voltage comparator and a fold logic circuit connected to an output of said voltage comparator, said voltage comparator having an input connected to said output terminal of said operational transconductance amplifier.

5. The converter of claim 4 wherein said fold logic circuit functions to selectively remove stored charge from said integrating capacitor when said stored charge exceeds said predetermined integration charge value.

6. The converter of claim 5 wherein said predetermined integration charge value is a function of a rate of removal of said stored charge from said integrating capacitor.

7. The converter of claim 1 wherein said folding circuit comprises a plurality of buffer compensation capacitors, each said buffer compensation capacitor having one end coupled to ground and another end switchably connected to an output of said fold buffer.

8. The converter of claim 1 further comprising a sensor input switch disposed between said integrating capacitor and said sensor diode.

9. A method of converting a charge input to a digital signal output, said method comprising the steps of:
charging an integrating capacitor to a predetermined integration charge value with the charge input;
charging a fold capacitor to a predetermined fold charge level with a fold voltage source;
transferring charge between said integrating capacitor and said fold capacitor for a predetermined transfer time interval; and
producing said digital signal output as a function of charge transferred by tracking said charge transferal via a fold logic circuit.

10. The method of claim 9 wherein said step of transferring said charge comprises a step of operating a fold switch connected to the fold capacitor.

11. The method of claim 10 wherein said step of operating said fold switch is controlled by said fold logic circuit.

12. A multi-channel charge to digital converter comprising:
a voltage divider;
a plurality of converter channels; and
a fold buffer coupled to said voltage divider, said fold buffer switchably connected to each of said converter channels,
wherein at least one of said converter channel comprises:
an integration circuit comprising an operational transconductance amplifier having an inverting input terminal and an output terminal, an integrating capacitor connected between said inverting input terminal and said output terminal, said integrating capacitor for storing a charge input selectively provided by a sensor diode; and
a folding circuit having a fold capacitor, said fold capacitor switchably coupled to said fold buffer for charging said fold capacitor to a predetermined fold charge value when said integrating capacitor stores said charge input selectively provided by the sensor diode, and said fold capacitor switchably decoupled from the fold buffer and coupled to said integrating capacitor for selectively receiving at least a portion of said stored charge input when said stored charge input exceeds a predetermined integration charge value.

13. The converter of claim 12 wherein said folding circuit further comprises a charge switch pair for switchably connecting said folding capacitor to said fold buffer.

14. The converter of claim 12 further comprising a second fold buffer, said fold capacitor switchably coupled to either said fold buffer or said second fold buffer.

15. The converter of claim 14 further comprising a second integrator circuit including a second operational transconductance amplifier, an inverting input terminal of said second operational transconductance amplifier coupled to said output terminal of said operational transconductance amplifier in said integration circuit.

* * * * *